(12) United States Patent
Takayama et al.

(10) Patent No.: US 7,605,023 B2
(45) Date of Patent: Oct. 20, 2009

(54) MANUFACTURING METHOD FOR A SEMICONDUCTOR DEVICE AND HEAT TREATMENT METHOD THEREFOR

(75) Inventors: Toru Takayama, Kanagawa (JP); Shunpei Yamazaki, Tokyo (JP); Tetsuji Yamaguchi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 10/650,046

(22) Filed: Aug. 28, 2003

(65) Prior Publication Data
US 2004/0077134 A1    Apr. 22, 2004

(30) Foreign Application Priority Data
Aug. 29, 2002 (JP) ............................. 2002-252193
Sep. 20, 2002 (JP) ............................. 2002-276319

(51) Int. Cl.
*H01L 21/00* (2006.01)
(52) U.S. Cl. ....................... 438/149; 438/151; 438/164; 257/E29.273
(58) Field of Classification Search ................. 438/149, 438/151–154, 795, 162–164, 486–488
See application file for complete search history.

(56) References Cited

U.S. PATENT DOCUMENTS 4,951,601 A    8/1990   Maydan et al.
5,043,299 A    8/1991   Chang et al.
5,286,296 A    2/1994   Sato et al.
5,306,651 A    4/1994   Masumo et al.

(Continued)

FOREIGN PATENT DOCUMENTS

JP          05-044017           2/1993

(Continued)

OTHER PUBLICATIONS

Official Action dated Oct. 4, 2004 for U.S. Appl. No. 10/664,866.

*Primary Examiner*—Thanh Nguyen
(74) *Attorney, Agent, or Firm*—Eric J Robinson; Robinson Intellectual Property Law Office, P.C.

(57) ABSTRACT

To apply a technique of forming a dense insulating film with a high quality in a thin film element such as a TFT formed on a glass substrate by eliminating an influence of contraction of the substrate caused by heat treatment in a manufacturing process for the element, and a semiconductor device using the same, which enables high performance and reliability. In a step of forming the thin film element composed of a laminate of plural thin films using the glass substrate, in order to avoid a thermal damage on the substrate, heat treatment is performed such that a coating film for absorbing radiation from a heat source is locally formed in a specific portion of the substrate where the thin film element is to be formed. For the substrate to be applied in the present invention, a raw material low in absorptance with respect to the radiation from the heat source and hard to be heated is adopted. Thus, the heat treatment is performed in such a way that the coating film for absorbing the radiation from the heat source is locally formed on a main surface of the substrate and that a target structure is heated through conductive heating from the coating film.

21 Claims, 26 Drawing Sheets

U.S. PATENT DOCUMENTS

| | | | |
|---|---|---|---|
| 5,310,410 A | 5/1994 | Begin et al. | |
| 5,324,360 A | 6/1994 | Kozuka | |
| 5,587,520 A | 12/1996 | Rhodes | |
| 5,771,110 A | 6/1998 | Hirano et al. | |
| 6,051,453 A | 4/2000 | Takemura | |
| 6,177,302 B1 | 1/2001 | Yamazaki et al. | |
| 6,261,877 B1 | 7/2001 | Yamazaki et al. | |
| 6,323,142 B1 | 11/2001 | Yamazaki et al. | |
| 6,323,528 B1 | 11/2001 | Yamazaki et al. | |
| 6,329,229 B1 | 12/2001 | Yamazaki et al. | |
| 6,492,659 B1 | 12/2002 | Yamazaki et al. | |
| 6,492,681 B2 | 12/2002 | Koyama et al. | |
| 6,498,369 B1 | 12/2002 | Yamazaki et al. | |
| 6,500,704 B1 | 12/2002 | Hirano et al. | |
| 6,555,843 B1 | 4/2003 | Yamazaki et al. | |
| 6,576,534 B1 | 6/2003 | Zhang et al. | |
| 6,599,790 B1 | 7/2003 | Yamazaki et al. | |
| 6,599,818 B2 | 7/2003 | Dairiki | |
| 6,602,765 B2 | 8/2003 | Jiroku et al. | |
| 6,614,076 B2 | 9/2003 | Kawasaki et al. | |
| 6,620,658 B2 | 9/2003 | Isobe et al. | |
| 6,632,749 B2 | 10/2003 | Miyasaka et al. | |
| 6,790,714 B2 | 9/2004 | Hirano et al. | |
| 6,822,261 B2 | 11/2004 | Yamazaki et al. | |
| 6,838,397 B2 | 1/2005 | Takayama et al. | |
| 7,183,229 B2 | 2/2007 | Yamanaka | |
| 2001/0009283 A1 | 7/2001 | Arao et al. | |
| 2001/0015441 A1 | 8/2001 | Kawasaki et al. | |
| 2001/0049163 A1* | 12/2001 | Yamazaki et al. | 438/158 |
| 2002/0000551 A1* | 1/2002 | Yamazaki et al. | 257/59 |
| 2002/0001886 A1 | 1/2002 | Ohtani | |
| 2002/0043660 A1 | 4/2002 | Yamazaki et al. | |
| 2002/0056839 A1 | 5/2002 | Joo et al. | |
| 2002/0061661 A1* | 5/2002 | Dairiki | 438/795 |
| 2002/0101395 A1 | 8/2002 | Inukai | |
| 2002/0110940 A1 | 8/2002 | Yamagata et al. | |
| 2002/0113248 A1 | 8/2002 | Yamagata et al. | |
| 2002/0121860 A1 | 9/2002 | Seo et al. | |
| 2002/0160554 A1 | 10/2002 | Isobe et al. | |
| 2003/0013280 A1 | 1/2003 | Yamanaka | |
| 2004/0021177 A1 | 2/2004 | Akimoto et al. | |
| 2004/0132293 A1 | 7/2004 | Takayama et al. | |
| 2007/0087492 A1 | 4/2007 | Yamanaka | |

FOREIGN PATENT DOCUMENTS

| | | |
|---|---|---|
| JP | 07-321335 | 12/1995 |
| JP | 08-051076 | 2/1996 |
| JP | 09-260286 | 10/1997 |
| JP | 10-026772 | 1/1998 |
| JP | 10-084085 | 3/1998 |
| JP | 2001-102585 | 4/2001 |
| JP | 2002-246328 | 8/2002 |
| JP | 2002-252174 | 9/2002 |

* cited by examiner

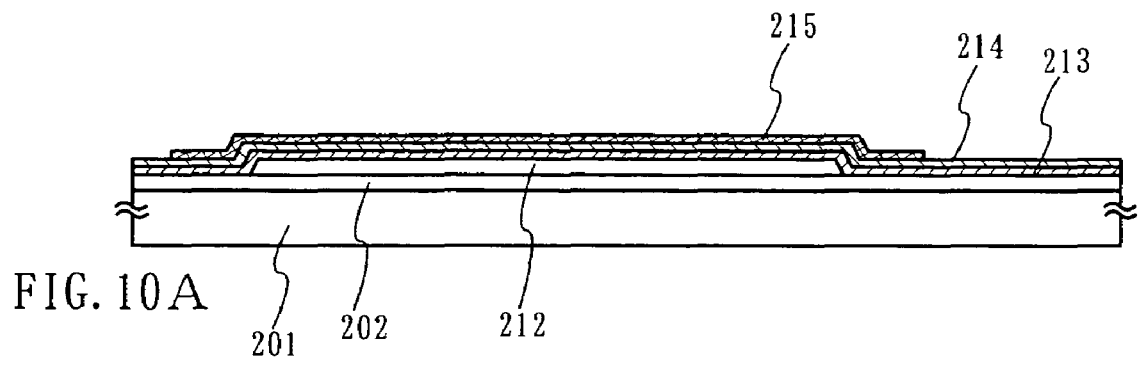
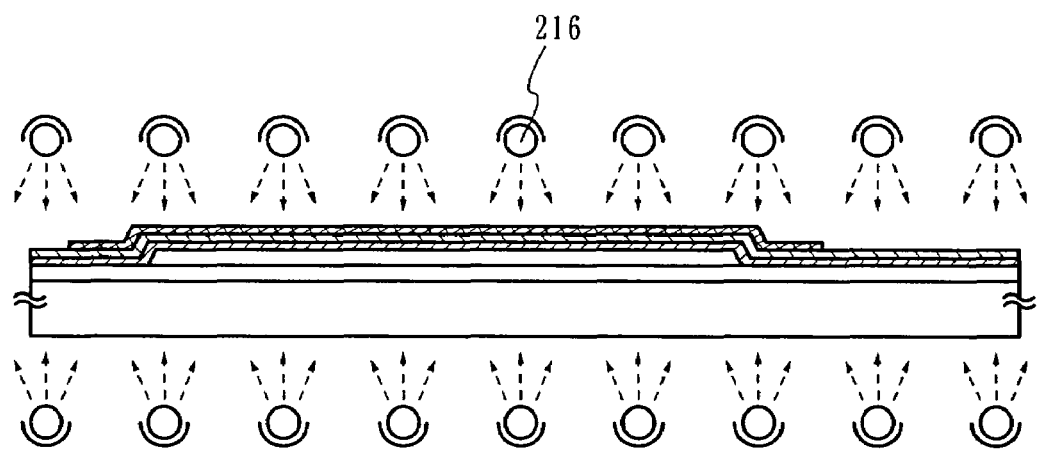
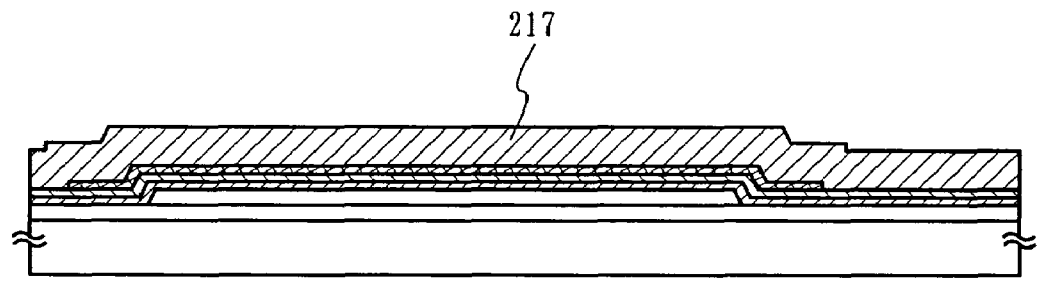
FIG. 10A
FIG. 10B
FIG. 10C

MANUFACTURING METHOD FOR A SEMICONDUCTOR DEVICE AND HEAT TREATMENT METHOD THEREFOR

BACKGROUND OF THE INVENTION

1. Field of the Invention

The present invention relates to a manufacturing method for a semiconductor device having a semiconductor element formed by laminating a semiconductor layer and an insulating layer on a substrate having an insulating surface. In particular, the present invention relates to a technique effectively applied to a manufacturing method for a semiconductor device in which a substrate is made of a raw material that is thermally fragile, such as glass.

Also, the present invention relates to a heat treatment method in which heat treatment is conducted through irradiation of an incoherent electromagnetic wave within a wavelength band ranging at least from a visible light band to an infrared band. In particular, the present invention relates to a technique effectively applicable to a case of using a substrate made of a raw material with a low heat resistance temperature, such as glass.

2. Description of the Related Art

In recent years, a technique has been developed, which is for manufacturing a thin film transistor (TFT) using a glass substrate by using polycrystalline silicon obtained through crystallization by laser annealing. The glass substrate used for such applications is made of materials such as barium borosilicate glass and aluminosilicate glass with a distortion point of 700° C. or lower. Accordingly, an allowable maximum temperature in a manufacturing process for the TFT should be set as a temperature which is not more than the distortion point and at which the glass substrate does not deform. Thus, a growing importance is placed on laser annealing or rapid thermal annealing (RTA) technique for use in crystallization of silicon or activation of donor or acceptor impurities doped into silicon.

RTA is a heat treatment technique for rapidly heating a target for a period of several microseconds to several ten seconds. This technique is for annealing while using the electromagnetic wave within the wavelength band ranging from the visible light band to the infrared band, which is radiated form a halogen lamp or the like. As a technique of activating an n-type impurity injected into a polycrystalline silicon film on the glass substrate using the RTA technique, disclosed in, for example, JP 2001-102585 A (see pp. 5–6, FIG. 1) is a method of accumulating heat in a metal layer formed between the glass substrate and the polycrystalline silicon film in order to enable effective action of the heat generated by RTA.

By the way, in a technique of manufacturing a MOS transistor on a single crystal silicon substrate, a thermal oxidation film obtained by oxidizing a silicon surface at a temperature of 900° C. or higher is effectively used. On the other hand, the above-mentioned glass substrate deforms (changes its size or warps due to contraction) when being subjected to the heat treatment at a high temperature. Depending on the design rule of an integrated circuit, such deformation may cause trouble in a light exposure process where a highly accurate mask alignment is required in the order of submicron. That is, a position at which a gate electrode overlaps with a semiconductor layer or a relative position of contact holes is shifted, which makes it impossible to complete an element with a size defined at an initial design stage. The effects of such a problem become more remarkable as high-density packaging of the integrated circuit proceeds (as miniaturization of the element proceeds).

However, plasma CVD or sputtering involves a reaction using a plasma. The following disadvantages are thus pointed out. That is, a film formation surface is damaged by a high-energy particle in the plasma, so that defects or pinholes develop in the deposited film, or a large number of fixed charges or interface levels are caused therein. In addition, the film contains several atoms % of hydrogen and thus, thermal stability falls. Further, the hydrogen in the film dissociates at a relatively low temperature, which causes unstable element characteristics.

In contrast, according as the miniaturization of the integrated circuit formed using the TFT proceeds, a gate insulating film should be made thin based on the scaling law. In other words, even if only the planar TFT size is reduced while maintaining a thickness of the gate insulating film, a variation in characteristics increases. Further, a driving power of the TFT does not increase. As a result, the device using such TFTs cannot attain high performance.

However, in a silicon oxide film or silicon nitride film obtained through deposition at just a temperature of 400° C. or lower, unlike in a clean thermal oxidation film obtained by oxidizing the silicon at a temperature of 900° C. or higher, the influence of the fixed charge or interface level density becomes conspicuous. As a result, the reduction in variation of threshold voltage or gate leak cannot be substantially realized.

In modifying the film material through the heat treatment, if the modification is based on a thermal activation reaction, the heat treatment effect can be exerted at a higher temperature. However, as disclosed in JP 2001-102585 A, in the method of accumulating the heat in the metal film formed between the glass substrate and the polycrystalline silicon film, any limitation is imposed on an element shape. Further, effective heat treatment cannot be performed on sites for which the heat treatment really needs to be performed. For example, it is impossible to effectively modify the gate insulating film formed on the semiconductor layer by the heat treatment.

SUMMARY OF THE INVENTION

The present invention has been made with a view to solving the above-mentioned problems. Accordingly, it is an object of the present invention to apply a technique of forming a dense insulating film with a high quality in a thin film element such as a TFT formed on a thermally fragile substrate, such as glass while eliminating an influence of contraction of the substrate caused by heat treatment in a manufacturing process for the element, and a semiconductor device using the same, which enables high performance and reliability. Also, another object of the present invention is to provide a semiconductor device having a large-area integrated circuit with a transistor having an excellent insulating layer used as a structural element thereof.

The gist of the present invention resides in performing heat treatment (preferably rapid thermal annealing using as a heat source a lamp) on a specific portion of a substrate where a thin film element is formed, by locally forming a coating film for absorbing radiation from the heat source to thereby perform, without the thermal damage on the substrate, the heat treatment required for a step of forming the thin film element composed of a laminate of plural thin films, typically, TFT, by using the thermally fragile substrate such as glass. That is, a raw material low in absorptance with respect to the radiation from the heat source and hard to be heated is adapted for the substrate to be applied in the present invention. In addition, the heat treatment (preferably rapid thermal annealing using the lamp as the heat source) is performed while locally forming the coating film for absorbing the radiation from the heat source on a main surface of the substrate. Thus, a target structure is heated through conductive heating from the coating film for the heat treatment.

In the manufacturing process for the TFT, the heat treatment is performed plural times for the purpose of achieving crystallization of a semiconductor layer, activation of injected donor or acceptor elements, or hydrogenation. The glass substrate has a property of contracting by the heat treatment at a high temperature. The contraction hardly involves problems at about 400° C., but at 500° C. or higher, the contraction occurs at a rate of several hundreds to several thousands of ppm. Accordingly, the heat treatment is performed at a requisite maximum temperature prior to the formation of a maker as a reference on the substrate. In the subsequent steps, preferably, the substrate is not heated beyond the temperature. The above-mentioned gist of the present invention can include the following structures.

The present invention provides a manufacturing method for a semiconductor device, including performing heat treatment using a heat source for radiating an incoherent electromagnetic wave within a wavelength band ranging at least from a visible light band to an infrared band. The method includes: forming on a glass substrate a conductive layer heated by radiation of the electromagnetic wave; forming, between the glass substrate and the conductive layer, a semiconductor layer formed inside the conductive layer and an insulating layer covering a top surface and a side surface of the semiconductor layer; and selectively heating a region where the conductive layer is formed by irradiating the electromagnetic wave to thereby conduct the heat treatment on the semiconductor layer and the insulating layer. The substrate has a transmittance of 50% or higher with respect to the incoherent electromagnetic wave within the wavelength band ranging from the visible light band to the infrared band. Typically, barium borosilicate glass, aluminoborosilicate glass, or the like is selected therefor.

The method according to the present invention includes the following. That is, on a glass substrate having an insulating surface, a conductive layer is formed which is patterned to have a length of one side not larger than a thickness of the glass substrate, preferably 1/5 or smaller of the thickness. Further, between the glass substrate and the conductive layer, a semiconductor layer formed inside the conductive layer and an insulating layer covering a top surface and a side surface of the semiconductor layer are formed. Then, while selectively heating a region where the conductive layer is formed by using a heat source for irradiating an incoherent light within a wavelength band ranging at least from a visible light band to an infrared band, the heat treatment is conducted on the semiconductor layer and the insulating layer. The substrate has a transmittance of 50% or higher, preferably 80% or higher with respect to the incoherent electromagnetic wave within the wavelength band ranging from the visible light band to the infrared band. Typically, barium borosilicate glass, aluminoborosilicate glass, or the like is selected therefor.

The method according to the present invention includes the following. That is, semiconductor layers that are divided from each other in an island-like shape are formed on a substrate having an insulating surface, and a conductive layer covering an entire surface of each of the semiconductor layers and having ends situated outside each of the semiconductor layers is formed on each of the semiconductor layers through an insulating layer. Then, a region where the conductive layer is formed is selectively heated by irradiating an incoherent electromagnetic wave within a wavelength band ranging at least from a visible light band to an infrared band to thereby conduct heat treatment on each of the semiconductor layers and the insulating layer. Alternatively, the method includes: forming a first insulating layer on a substrate having an insulating surface; forming semiconductor layers that are divided from each other in an island-like shape on the first insulating layer; forming a second insulating layer that covers a top surface and a side surface of each of the semiconductor layers; forming on the second insulating layer a conductive layer covering the top surface and an end surface of each of the semiconductor layers and having ends situated outside each of the semiconductor layers; selectively heating a region where the conductive layer is formed, by irradiating an incoherent electromagnetic wave within a wavelength band ranging at least from a visible light band to an infrared band to thereby conduct heat treatment on each of the semiconductor layers and the insulating layer; and etching a metal layer and the conductive layer to form a gate electrode overlapping with the semiconductor layer.

The method according to the present invention includes the following. That is, semiconductor layers that are divided from each other in an island-like shape are formed on a glass substrate, and a conductive layer covering an entire surface of each of the semiconductor layers and having ends situated outside each of the semiconductor layers is formed on each of the semiconductor layers through an insulating layer. Then, a region where the conductor layer is selectively heated by irradiating an incoherent electromagnetic wave within a wavelength band ranging at least from a visible light band to an infrared band for 30 to 300 seconds to thereby conduct heat treatment on each of the semiconductor layers and the insulating layer. Alternatively, the method includes: forming semiconductor layers that are divided from each other in an island-like shape, on a substrate having a transmittance of 50% or higher (preferably 80% or higher) with respect to an incoherent electromagnetic wave within a wavelength band ranging from a visible light band to an infrared band, which is radiated from a heat source; forming a conductive layer covering an entire surface of each of the semiconductor layers and having ends situated outside each of the semiconductor layers, on each of the semiconductor layers through an insulating layer; and selectively heating a region where the conductive layer is formed through radiation from the heat source for 30 to 300 seconds to thereby conduct heat treatment on each of the semiconductor layers and the insulating layer.

The conductive layer is formed of metal, metal alloy, metal compound, silicide, or the like, preferably, a high melting-point metal such as molybdenum (Mo), tungsten (W), or titanium (Ti), a metal nitride such as titanium nitride (TiN), tantalum nitride (TaN), or tungsten nitride (WN), or silicide such as tungsten silicide ($WSi_2$), molybdenum silicide ($MoSi_2$), titanium silicide ($TiSi_2$), tantalum silicide ($TaSi_2$), chromium silicide ($CrSi_2$), cobalt silicide ($CoSi_2$), or platinum silicide ($PtSi_2$). Polycrystalline silicon doped with phosphorous and boron may be used therefor.

The structures of the present invention are applicable to the heat treatment performed particularly for the purpose of achieving modification of a laminate including a semiconductor layer where a channel region and a source/drain of the TFT are formed and a gate insulating film. The conductive layer formed at this time can be left as part of the gate electrode after the heat treatment.

Also, rapid thermal annealing using as a heat source a lamp having a radiation spectrum within a wavelength band ranging from a visible light band to an infrared band, such as tungsten halogen lamp or metal halide lamp is applied to the heat treatment, and the conductive layer for absorbing the radiation from the heat source and converting it into heat is locally formed on the substrate, whereby the heat treatment can be substantially performed on that site at a temperature not less than a distortion point of the substrate.

In this way, the semiconductor layer and the insulating layer covering the top surface and the side surface of the semiconductor layer are formed between the substrate and the conductive layer with the ends of the semiconductor layer formed inside the conductive layer. Further, the heat treatment using the heat source for radiating the incoherent electromagnetic wave within the wavelength band ranging from the visible light band to the infrared band is performed, thereby heating a region where the conductive layer is formed. Therefore, the semiconductor layer is uniformly heated. That is, it is possible to prevent a stress from locally acting on the semiconductor layer. This can prevent the residual stress from acting on the semiconductor layer where an active layer of the TFT is formed, in particular, a site where a gate is formed.

The present invention provides a manufacturing method for a semiconductor device, including: a first heat treatment step of heating an entire surface of a glass substrate by radiation heating from a first heat source; a forming step of forming on the glass substrate non-transparent layers that are separated from each other in an island-like shape, the non-transparent layers each having a different, higher absorptance with respect to an incoherent electromagnetic wave within a wavelength band ranging at least from a visible light band to an infrared band, than the glass substrate; and a second heat treatment step of locally heating a region where each of the non-transparent layers having the high absorptance with respect to the incoherent electromagnetic wave is formed, by using a second heat source for radiating the incoherent electromagnetic wave.

The present invention provides a manufacturing method for a semiconductor device, including: a first heat treatment step of heating an entire surface of a glass substrate by radiation heating from a first heat source; a forming step of forming a non-transparent layer to overlap with a semiconductor layer formed in an island-like shape on the glass substrate through an insulating film, the non-transparent layer having a different, higher absorptance with respect to an incoherent electromagnetic wave within a wavelength band ranging at least from a visible light band to an infrared band, than the glass substrate; and a second heat treatment step of selectively heating a region where the non-transparent layer having the high absorptance with respect to the incoherent electromagnetic wave is formed, by using a second heat source for radiating the incoherent electromagnetic wave to thereby conduct heat treatment on the semiconductor layer and the insulating layer through conductive heating from the non-transparent layer.

In the above structures of the present invention, the non-transparent layer having the high absorptance with respect to the incoherent electromagnetic wave within the wavelength band ranging at least from the visible light band to the infrared band, is formed of a material selected from the group consisting of: high melting-point metal such as molybdenum (Mo), tungsten (W), titanium (Ti), or chromium (Cr); metal nitride such as titanium nitride (TiN), tantalum nitride (TaN), or tungsten nitride (WN); and silicide such as tungsten silicide ($WSi_2$), molybdenum silicide ($MoSi_2$), titanium silicide ($TiSi_2$), tantalum silicide ($TaSi_2$), chromium silicide ($CrSi_2$), cobalt silicide ($CoSi_2$), or platinum silicide ($PtSi_2$). A film is formed of such materials with a thickness of 10 to 50 nm, preferably, 20 to 40 nm. The film thus formed has a transmittance of 50% or lower, preferably 30% or lower, with respect to the incoherent electromagnetic wave within the wavelength band ranging from the visible light band to the infrared band. By using the film and the glass substrate having a transmittance of 60% or higher with respect to the incoherent electromagnetic wave within the same wavelength band in combination, the region where the non-transparent layer having the high absorptance is formed can be selectively heated. In other words, only the region for which the heat treatment should be performed on the glass substrate can be selectively heated. With the above structures, the second heat treatment can be performed at a temperature not less than the distortion point of the glass substrate (on the non-transparent layer region having the high absorptance), whereby a heat treatment effect can be increased.

The incoherent electromagnetic wave within the wavelength band ranging at least from the visible light band to the infrared band is radiated from a tungsten halogen lamp, a metal halide lamp, a xenon flash lamp, and the like inclusive of a visible light and an infrared light, or a light within a wavelength band of the visible light and the infrared light.

The present invention provides a manufacturing method for a semiconductor device, including: a first heat treatment step of heating an entire surface of a glass substrate by radiation heating from a first heat source; a forming step of forming on the glass substrate semiconductor layers that are separated from each other in an island-shape, an insulating layer covering a top surface and a side surface of each of the semiconductor layers, and a non-transparent layer overlapping with each of the semiconductor layers; and a second heat treatment step of selectively heating a region where the non-transparent layer is formed, by radiation from a second heat source for radiating an incoherent electromagnetic wave within a wavelength band ranging at least from a visible light band to an infrared band to thereby conduct heat treatment on the semiconductor layers and the insulating layer through conductive heating from the non-transparent layer.

The present invention provides a manufacturing method for a semiconductor device, including: a first heat treatment step of heating an entire surface of a glass substrate by radiation heating from a first heat source; a forming step of forming on the glass substrate semiconductor layers that are separated from each other in an island-shape, an insulating layer composed of a laminate of a silicon oxide film and a silicon nitride film and adapted to cover a top surface and a side surface of each of the semiconductor layers, and a non-transparent layer overlapping with each of the semiconductor layers; and a second heat treatment step of selectively heating a region where the non-transparent layer is formed, by radiation from a second heat source for radiating an incoherent electromagnetic wave within a wavelength band ranging at least from a visible light band to an infrared band to thereby conduct heat treatment on the semiconductor layers and the insulating layer through conductive heating from the non-transparent layer.

In the above structures of the present invention, the non-transparent layer is formed of a material selected from the group consisting of: high melting-point metal such as molybdenum (Mo), tungsten (W), titanium (Ti), or chromium (Cr); metal nitride such as titanium nitride (TiN), tantalum nitride (TaN), or tungsten nitride (WN); and silicide such as tungsten silicide ($WSi_2$), molybdenum silicide ($MoSi_2$), titanium silicide ($TiSi_2$), tantalum silicide ($TaSi_2$), chromium silicide ($CrSi_2$), cobalt silicide ($CoSi_2$), or platinum silicide ($PtSi_2$). A film is formed of such materials with a thickness of 10 to 50 nm, preferably, 20 to 40 nm. The film thus formed has a transmittance of 50% or lower, preferably 30% or lower, with respect to the incoherent electromagnetic wave within the wavelength band ranging from the visible light band to the infrared band. By using the film and the glass substrate having a transmittance of 60% or higher with respect to the incoherent electromagnetic wave within the same wavelength band in combination, the region where the non-transparent layer is formed can be selectively heated. In other words, only the region for which the heat treatment should be performed on the glass substrate can be selectively heated. With the above structures, the second heat treatment can be performed at a temperature not less than the distortion point of the glass substrate (on a region where the non-transparent layer is formed), whereby a heat treatment effect can be increased.

The incoherent electromagnetic wave within the wavelength band ranging at least from the visible light band to the infrared band is radiated from a tungsten halogen lamp, a metal halide lamp, a xenon flash lamp, and the like inclusive of a visible light and an infrared light, or a light within a wavelength band of the visible light and the infrared light.

A transistor formed on the glass substrate with the above structures is applicable to a semiconductor device including an n-channel TFT with a channel length of 0.3 to 3 μm or smaller, preferably 0.35 to 1.5 μm or smaller and a lightly doped drain (LDD). That is, by selectively heating a specific site (region where the transistor is formed) on the glass substrate, the heat contraction of the glass substrate can be suppressed, thus making it possible to secure an accuracy in mask alignment and to cope with a reduction in design rule in a satisfactory manner.

The present invention provides a heat treatment method including: a first heat treatment step of contracting a glass substrate, the first heat treatment step including a step of heating an entire surface of the glass substrate and a step of subsequently cooling the substrate down to a room temperature; a forming step of forming on the glass substrate non-transparent layers that are separated from each other in an island-shape, the non-transparent layers each having a different, higher absorptance with respect to an incoherent electromagnetic wave within a wavelength band ranging at least from a visible light band to an infrared band, than the glass substrate; and a second heat treatment step of locally heating a region where each of the non-transparent layers having the high absorptance with respect to the electromagnetic wave is formed, by radiation heat of the incoherent electromagnetic wave.

The present invention provides a heat treatment method including: a first heat treatment step of contracting a glass substrate, the first heat treatment step including a step of heating an entire surface of the glass substrate and a step of subsequently cooling the substrate down to a room temperature; a forming step of forming on the glass substrate a non-transparent layer to overlap with a semiconductor layer formed in an island-like shape through an insulating film, the non-transparent layer having a different, higher absorptance with respect to an incoherent electromagnetic wave within a wavelength band ranging at least from a visible light band to an infrared band, than the glass substrate; and a second heat treatment step of locally heating a region where the non-transparent layer having the high absorptance with respect to the electromagnetic wave is formed by radiation heat of the incoherent electromagnetic wave to thereby conduct heat treatment on the semiconductor layer and the insulating film through conductive heating from the region.

In the above structures of the present invention, the non-transparent layer having the high absorptance is formed of a material selected from the group consisting of: high melting-point metal such as molybdenum (Mo), tungsten (W), titanium (Ti), or chromium (Cr); metal nitride such as titanium nitride (TiN), tantalum nitride (TaN), or tungsten nitride (WN); and silicide such as tungsten silicide ($WSi_2$), molybdenum silicide ($MoSi_2$), titanium silicide ($TiSi_2$), tantalum silicide ($TaSi_2$), chromium silicide ($CrSi_2$), cobalt silicide ($CoSi_2$), or platinum silicide ($PtSi_2$). A film is formed of such materials with a thickness of 10 to 50 nm, preferably, 20 to 40 nm. The film thus formed has a transmittance of 50% or lower, preferably 30% or lower, with respect to the incoherent electromagnetic wave within the wavelength band ranging from the visible light band to the infrared band. By using the film and the glass substrate having a transmittance of 60% or higher with respect to the incoherent electromagnetic wave within the same wavelength band in combination, the region where the non-transparent layer having the high absorptance is formed can be selectively heated. In other words, only the region for which the heat treatment should be performed on the glass substrate can be selectively heated. With the above structures, the second heat treatment can be performed at a temperature not less than the distortion point of the glass substrate (on the non-transparent layer region having the high absorptance), whereby a heat treatment effect can be increased.

According to the present invention, the semiconductor layer and the insulating layer covering the top surface and the side surface of the semiconductor layer are formed between the substrate and the conductive layer with the semiconductor layer formed inside the conductive layer. Further, the heat treatment using the heat source for radiating the incoherent electromagnetic wave within the wavelength band ranging from the visible light band to the infrared band is performed, whereby the stress is dispersed to form an active layer of the TFT. In particular, the residual stress on a site where the gate is formed can be avoided. That is, with respect to the transistors formed on a thermally fragile substrate, such as glass, a suitably applicable, dense, and high-quality insulating film can be formed. Also, according to the present invention, the width of the gate wiring connected with the top-hat gate electrode of the two-layer structure can be freely set (since no peak formed by the conductive layer constituting a lower layer exists), whereby the high-density arrangement of the wirings can be achieved.

According to the present invention, the semiconductor layer and the insulating layer covering the top surface and the side surface of the semiconductor layer are formed between the substrate and the non-transparent layer with the semiconductor layer formed inside the conductive layer. Further, the heat treatment using the heat source for radiating the incoherent electromagnetic wave within the wavelength band ranging from the visible light band to the infrared band is performed, whereby the stress is dispersed and the residual stress on the semiconductor layer where the active layer of the TFT is formed can be avoided. Also, according to the present invention, the heat treatment technique can be provided, with which the contraction of the substrate due to the heat treatment is suppressed and the TFT with the channel length of 0.35 to 2.5 μm can be formed on the glass substrate. Also, according to the present invention, with respect to the transistors formed on the thermally fragile substrate, such as glass, a suitably applicable, dense, and high-quality insulating film can be formed.

According to the heat treatment method of the present invention, only the region for which the heat treatment should be performed on the glass substrate can be selectively heated. With the above structures, the second heat treatment can be performed at a temperature not less than the distortion point of the glass substrate (on the non-transparent layer region having the high absorptance), whereby the heat treatment effect can be increased.

BRIEF DESCRIPTION OF THE DRAWINGS

In the accompanying drawings:

FIGS. 10A to 10C are explanatory views each showing a manufacturing method for a semiconductor device according to the present invention;

DETAILED DESCRIPTION OF THE PREFERRED EMBODIMENTS

Hereinafter, an embodiment mode of the present invention will be described with reference to the accompanying drawings. Note that the present invention can be embodied in various different modes. It would be readily understood by those skilled in the art that various modifications may be made regarding embodiment modes and details of the present invention without departing from the gist and scope of the present invention. Accordingly, the present invention should not be construed as being limited to the following description of the embodiment mode.

According to the present invention, an effect of heat treatment can be effectively exerted, which is required in a manufacturing process for a thin film element formed by appropriately laminating thin films of a semiconductor and a insulator or conductor on a substrate. In particular, according to the present invention, in the process of forming the thin film element represented by a TFT using a substrate with a distortion point of 700° C. or lower, such as glass, which is thermally fragile, a specific portion on the substrate, in which the thin film element is formed is selectively heated so as to avoid the thermal damage caused onto the substrate due to the requisite heat treatment in the process and to suppress a change in size of a pattern formed on the substrate surface through a light exposure process. For that purpose, coating films capable of receiving radiation from a heat source to thereby increase the temperature at the site are locally formed for the heat treatment. Through conductive heating from the locally formed coating films, a target of the heat treatment formed on the substrate is heated for the heat treatment.

A heat treatment method that can meet such a purpose adopts heat treatment means called lamp annealing or rapid thermal annealing (RTA) using such a heat source as to radiate an incoherent electromagnetic wave, for example, the electromagnetic wave within a wavelength band ranging at least from a visible light band to an infrared band such as a tungsten halogen lamp, a metal halide lamp, or a xenon flash lamp.

Figure 3:
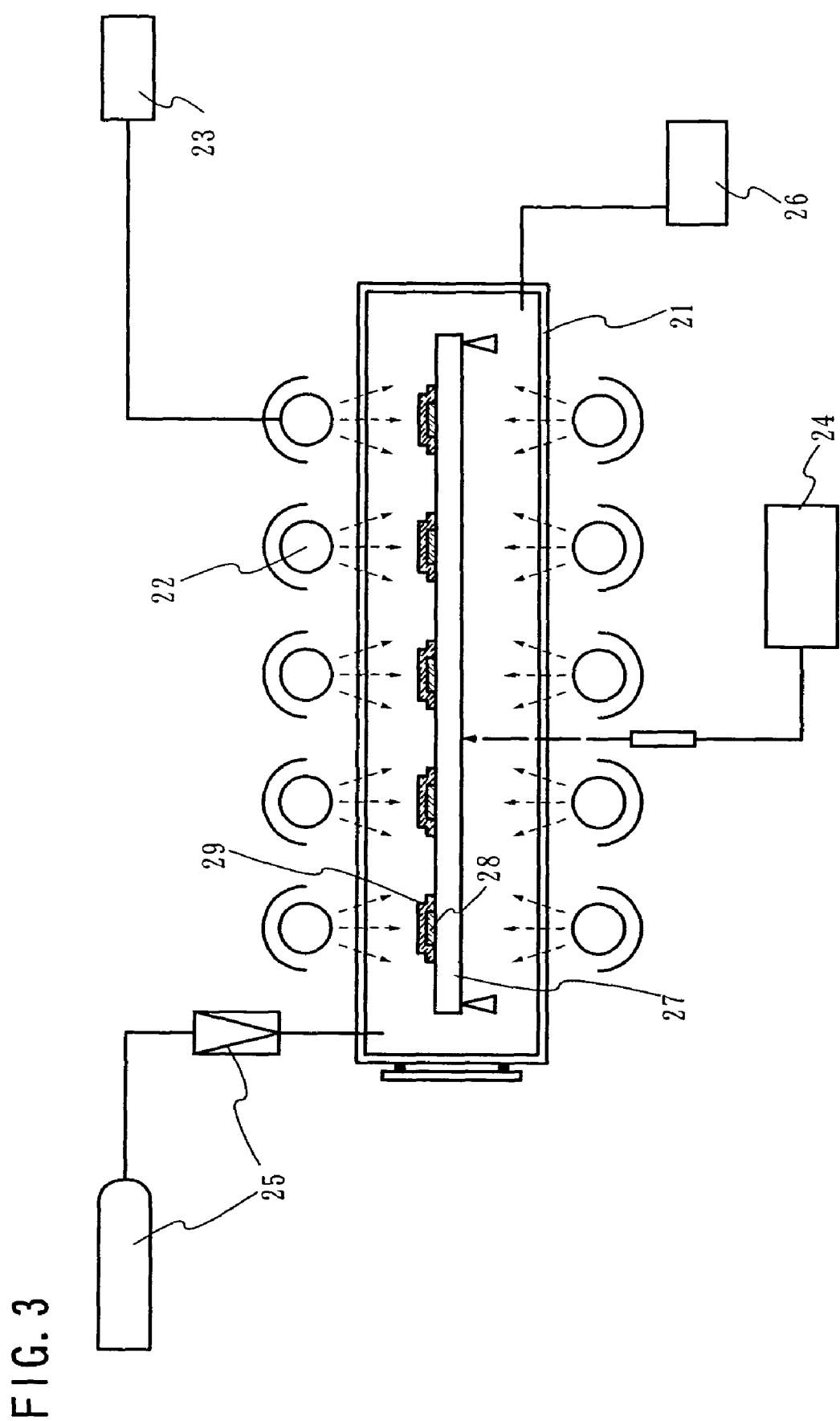
FIG. 3 is an explanatory view showing a structure of an RTA apparatus.

An example of a heat treatment apparatus applied to the present invention is shown in FIG. 3. A halogen lamp as a heat source 22, a reaction tube 21 formed of quartz etc., capable of transmitting the radiation from the heat source, a gas supplying means 25 for supplying an inert gas into the reaction tube 21, an exhaust means 26 for exhausting the gas in the reaction tube 21, a temperature detecting means 24 for measuring a temperature of an object to be processed in the reaction tube 21, which varies due to the radiation from the heat source 22, and the like constitute a main part of the heat treatment apparatus.

One main surface of a substrate 27 placed in the reaction tube 201 has a structure and a non-transparent layer 29 formed thereon. The structure is formed into a predetermined shape using a semiconductor layer and an insulating film and covered with the non-transparent layer 29. A control power source 23 enables the radiation from the heat source 22. Heating is performed at a rate of temperature increase of 100 to 200° C./sec with respect to a preset heating temperature of 500 to 800° C. The preset heating temperature corresponds to a target heat treatment temperature detected by the temperature detecting means 24. The temperature detecting means includes a pyrometer.

A relationship between the heat treatment temperature and a heat treatment time should be considered in balance with a heat resistance temperature of the substrate. The distortion point serves as a reference as for the glass substrate such as an aluminosilicate glass substrate. In the heat treatment performed at the temperature equal to or lower than the distortion point, heating can be performed over a relatively long period of time, for example, 300 seconds or more as an allowable period. On the other hand, when positively aiming at achieving a heat treatment effect, the heat temperature equal to or higher than the distortion point is effective. In this case, the heating time is set to 30 to 300 seconds, preferably 60 to 180 seconds. Needless to say, the heating time can be regarded as the cumulative heating time. The electromagnetic wave may be radiated from the heat source 22 in a pulse shape for the heat treatment once or repeatedly plural times.

The local heat treatment targeted at the structure formed on the substrate can be achieved by the following combination: the heat treatment method using the heat source that radiates the incoherent electromagnetic wave within the wavelength band ranging at least from the visible light band to the infrared band; and the formation of the non-transparent layer absorbing the electromagnetic wave on the substrate having a transmittance of 60% or more, preferably 80% or more with respect to the electromagnetic wave within the above wavelength band.

The substrate to be applied in the present invention is made of a material capable of transmitting the light within the visible light band. Examples of the substrate include a commercially available glass substrate called no-alkali glass such as barium borosilicate glass or aluminosilicate glass. In addition, quartz or sapphire can be used for the substrate. The above-mentioned substrates have such a characteristic that a transmittance with respect to the incoherent electromagnetic wave within the wavelength band ranging from the visible light band to the infrared band is 60% or more, preferably 80% or more. In addition, in order to reduce the change in size of the glass substrate due to a heat history in the manufacturing process, the heat treatment is first performed on the glass substrate for a long period of time at a temperature substantially equal to the glass distortion point to thereby contract the glass substrate in advance. The glass substrate undergoes the heat contraction such that a contraction amount after the temperature returns to a room temperature increases as the heat temperature is performed at a higher temperature. Further, the more the substrate is cooled in a cooling process, the larger the contraction amount.

Examples of materials for the non-transparent layer with respect to the incoherent electromagnetic wave within the wavelength band ranging at least from the visible light band to the infrared band include: high melting-point metal such as molybdenum (Mo), tungsten (W), or titanium (Ti); metal nitride such as titanium nitride (TiN), tantalum nitride (TaN) or tungsten nitride (WN); and silicide such as tungsten silicide ($WSi_2$), molybdenum silicide ($MoSi_2$), titanium silicide ($TiSi_2$), tantalum silicide ($TaSi_2$), chromium silicide ($CrSi_2$), cobalt silicide ($CoSi_2$), or platinum silicide ($PtSi_2$). Also, polycrystalline silicon doped with phosphorous or boron may be used for the non-transparent layer.

Figure 4:
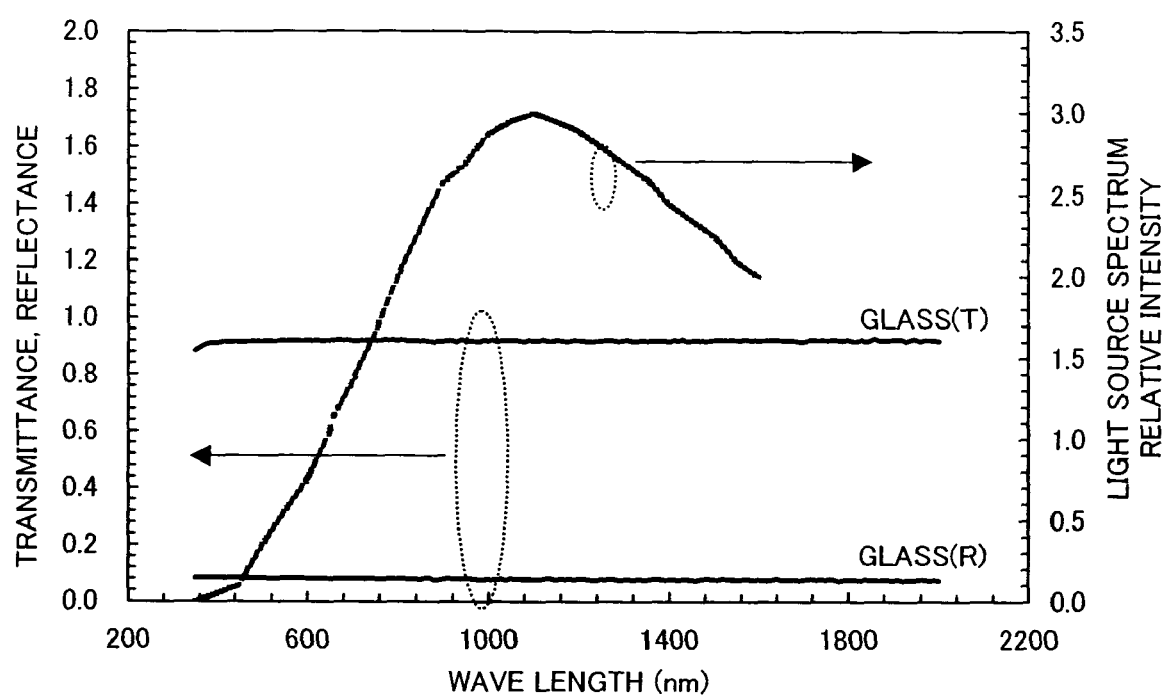
FIG. 4 is a graph showing transmittance and reflectance of a glass substrate.
Figure 5:
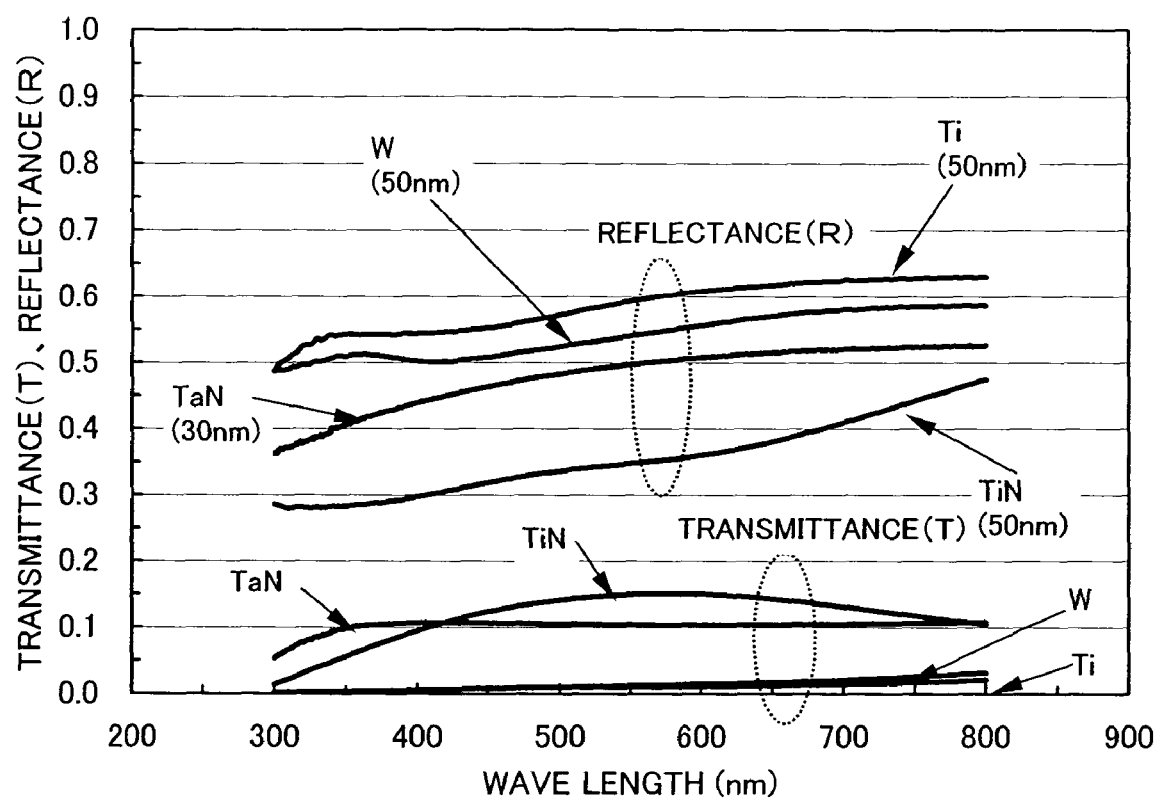
FIG. 5 is a graph showing transmittance and reflectance of a film formed of W, Ti, TiN, or TaN on a glass substrate.

FIG. 4 is a graph showing the transmittance and reflectance of the glass substrate having a thickness of 0.7 mm, which is formed of aluminosilicate as a raw material. In the graph, a radiation spectrum of the tungsten halogen lamp is additionally shown using the same axis representing the wavelength. Within the range of wavelength distribution from the visible light band to the infrared band of the spectrum of the radiation of the heat source, the transmittance with respect to the glass substrate reaches a value of 90% or more. Therefore, even if the substrate is subjected to the radiation from the heat source, it is hardly heated. On the other hand, FIG. 5 is a graph showing the transmittance and the reflectance of the non-transparent layer made of tungsten (W) (thickness: 50 nm), titanium (Ti) (thickness: 50 nm), titanium nitride (TiN) (thickness: 50 nm), or tantalum nitride (TaN) (thickness: 30 nm). The above metals and metal nitride each exhibit a transmittance of 70% or less and a reflectance of 20% or less with respect to the radiation within the wavelength band ranging from 300 to 800 nm. As will be apparent from the comparison between FIG. 4 and FIG. 5, by partially forming light absorbing layers, which have a property as an absorber against the applied pulsed lights with the respective wavelengths, on the substrate capable of transmitting the light with such a spectrum, the light absorbing layers are selectively used to absorb the light, which makes it possible to locally heat the substrate.

Figure 6A:
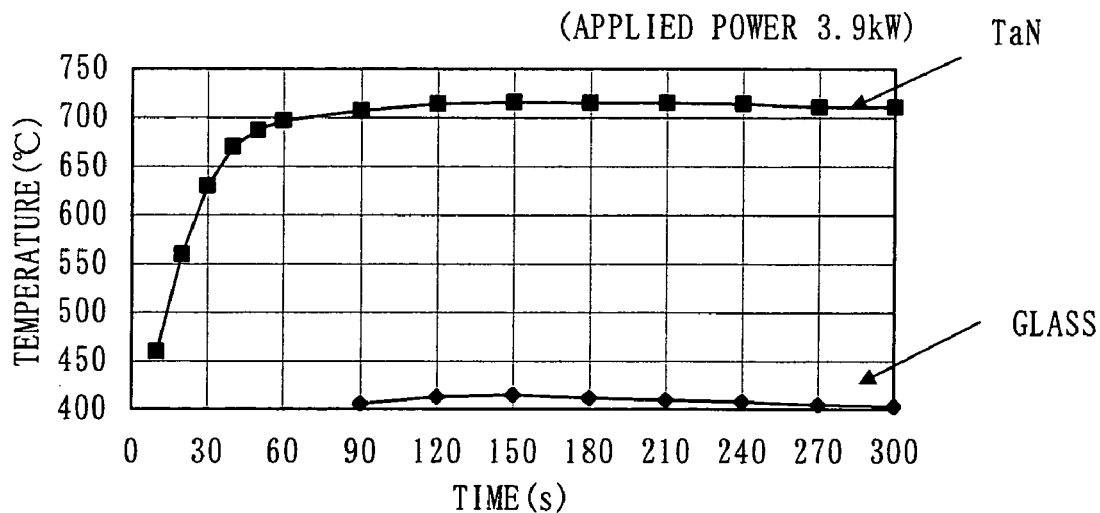
FIGS. 6A to 6C are graphs each showing a relationship between a temperature and an irradiation time of a glass substrate and a tantalum nitride (TaN) film formed thereon with a thickness of 30 nm, an applied power being set constant.
Figure 6B:
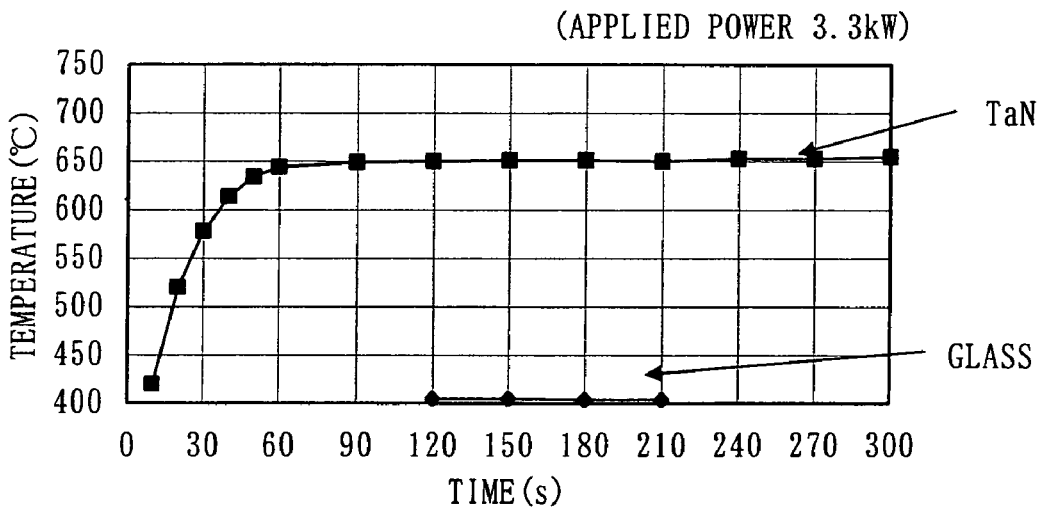
Figure 6C:
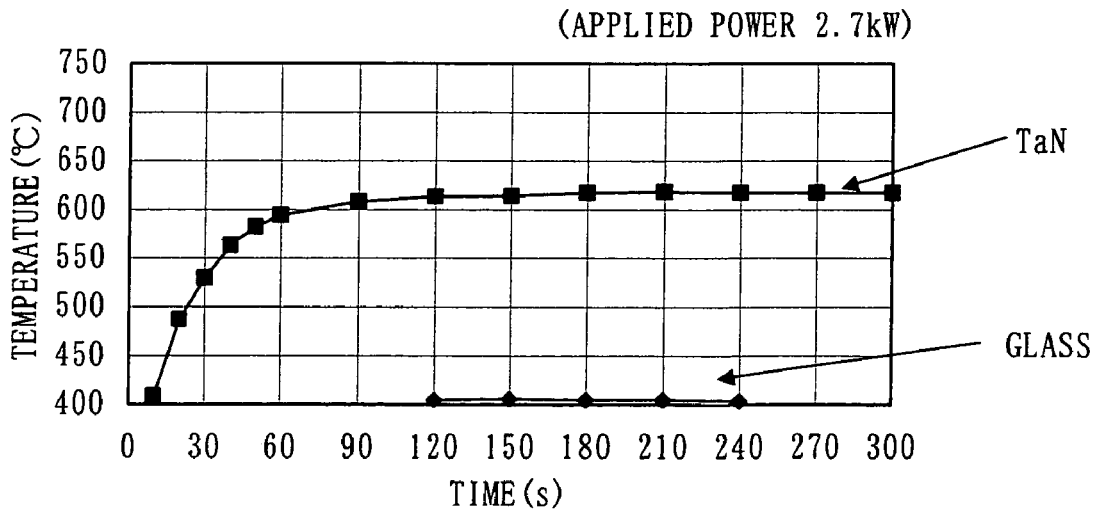

FIGS. 6A to 6C are graphs each showing a relationship between the temperature and the irradiation time of the above glass substrate and tantalum nitride (TaN) deposited on the same glass substrate with a thickness of 30 nm in the case of using the heat treatment apparatus structured as shown in FIG. 3 and setting the applied power to the heat source constant. In FIGS. 6A to 6C, FIG. 6A shows a case where the applied power to the heat source is 3.9 kW. The temperature of the glass substrate only rises to about 415° C., whereas the temperature of the substrate deposited with tantalum nitride (TaN) rises up to 715° C., which is reached approximately 60 seconds after the power application as a saturation temperature. Further, FIG. 6B shows a case where the applied power to the heat source is 3.3 kW. The temperature of the glass substrate only rises to about 405° C., whereas the temperature of the substrate deposited with tantalum nitride (TaN) rises up to 655° C. FIG. 6C shows a case where the applied power to the heat source is 2.7 kW. The temperature of the glass substrate only rises to about 405° C., whereas the temperature of the substrate deposited with tantalum nitride (TaN) rises up to 618° C. As described above, the temperature of the substrate deposited with tantalum nitride (TaN) varies depending on the applied power and is controllable. In contrast, the temperature of the glass substrate only rises to about 400° C. and no dependency on the applied power is observed.

Figure 7:
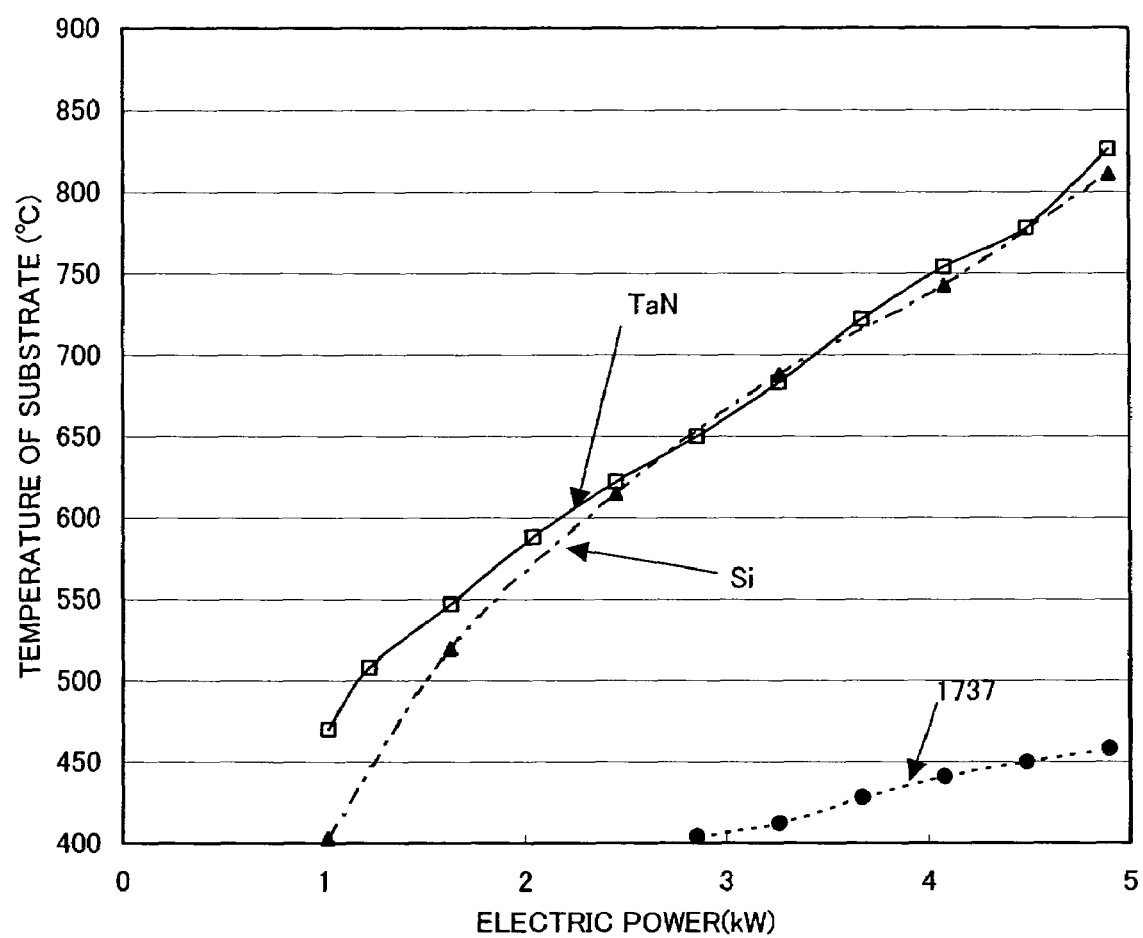
FIG. 7 is a graph showing a relationship between a temperature and an applied power of a glass substrate, a tantalum nitride (TaN) film formed thereon with a thickness of 30 nm, and a silicon wafer.

FIG. 7 is a graph showing a relationship between a temperature (saturation temperature) and an applied power of the above glass substrate, tantalum nitride (TaN) deposited onto the same glass substrate with a thickness of 30 nm, and a silicon wafer. An observed temperature difference between the glass substrate and tantalum nitride (TaN) is 200 to 300° C. This indicates that the substrate deposited with tantalum nitride (TaN) is susceptible to heating due to the radiation from the heat source.

However, the combination of the non-transparent layer made of tantalum nitride (TaN) or the like, which is susceptible to heating due to the radiation from the heat source, and the glass substrate hardly susceptible to heating as compared with the non-transparent layer involves the following disadvantage. That is, when the non-transparent layer is distributed while extending over the entire substrate surface in the wiring form, heat distortion remarkably develops and the glass substrate itself breaks off. To eliminate such a disadvantage, the non-transparent layer is divided into island-like layers, which totally occupy 20% or lower, preferably 15% or lower of the glass substrate surface area. Also, the length of one side of the island-like layer is set equal to or smaller than the thickness of the glass substrate, preferably equal to or smaller than 1/5 of the substrate thickness. By forming the island-like non-transparent layers in the dispersed form, the heat distortion applied to the glass substrate can be dispersed even upon the heat treatment to thereby prevent the glass substrate from breaking off.

Figure 1A:
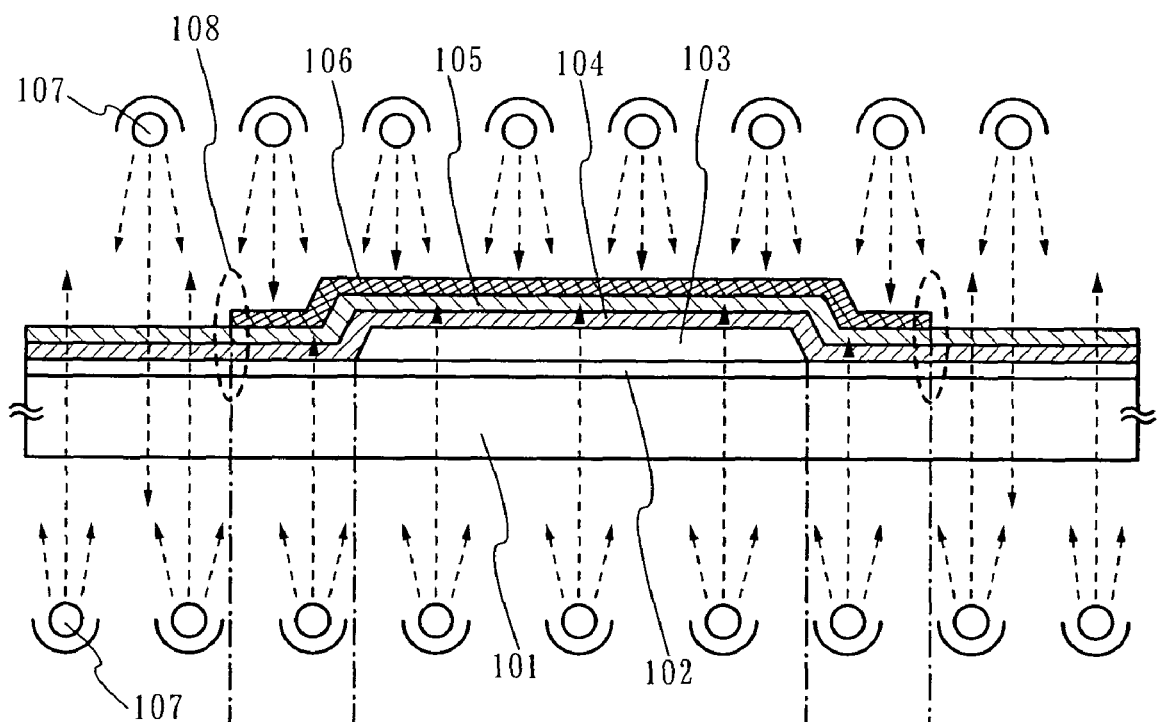
FIGS. 1A and 1B are explanatory views each showing a heat treatment method based on local heating according to the present invention.
Figure 1B:
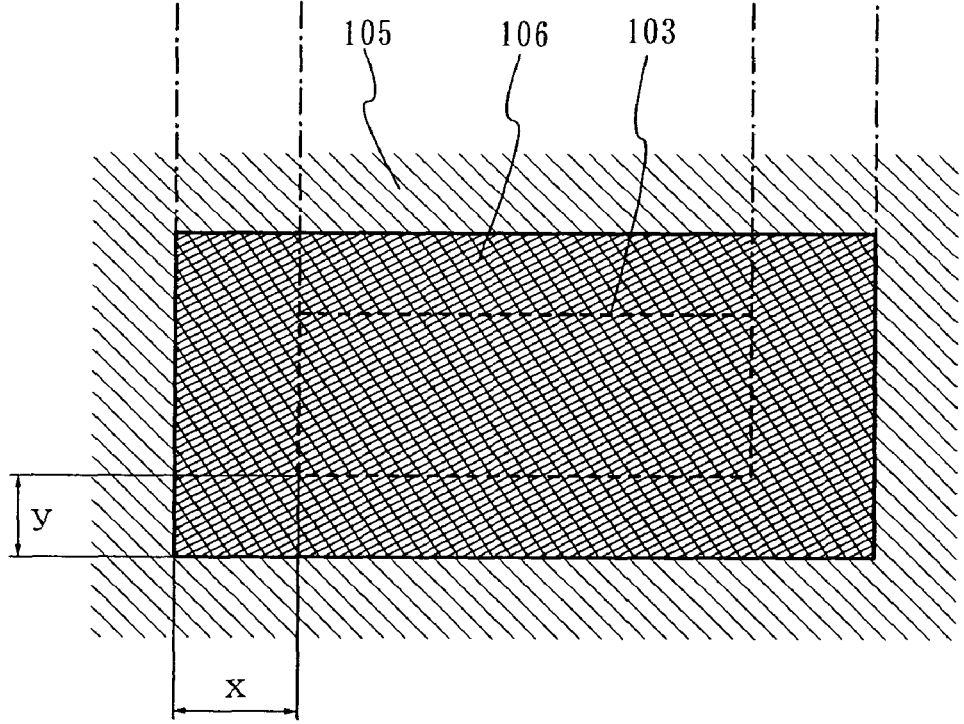

FIGS. 1A and 1B are explanatory views each showing the heat treatment according to the present invention in detail. FIG. 1A is a sectional structural view showing an arrangement of the semiconductor layer and the insulating layer, and the non-transparent layer, which are formed on the substrate, and a positional relationship between the heat source and such layers. In the figure, a mode is shown, in which a first insulating layer 102, an island-like semiconductor layer 103, second insulating layers 104 and 105, and a non-transparent layer 106 incapable of transmitting the incoherent electromagnetic wave within the wavelength band ranging at least from the visible light band to the infrared band are formed on a substrate 101, which undergoes the heat treatment using the radiation from a heat source 107. The heat source 107 is disposed opposite to a first main surface of the substrate 101 having the semiconductor layer 103, the non-transparent layer 106, and the like formed thereon. The radiation from the heat source 107 is thus applied to substantially the entire surface. In addition, the additional heat source is arranged on the backside of the first main surface, i.e., a second main surface side, and the substrate may be irradiated from one or both of the sides.

The non-transparent layer 106 is formed so as to cover the semiconductor layer 103 with its ends extending outside ends of the semiconductor layer 103. Also in the substrate 101, a region where the non-transparent layer 106 is formed and the other regions inevitably differ from each other in temperature rise. Thus, a thermal stress concentrates on a boundary portion 108 therebetween. The distortion resulting from the thermal stress is eliminated by arranging no semiconductor layer 103 at such a site. FIG. 1B is a top view thereof. The non-transparent layer 106 formed on the semiconductor layer 103 protrudes therefrom by length x and length y. The lengths x and y are 1 to 5 µm, preferably 2 to 3 µm. The non-transparent layer 106 formed into an island-like shape similarly to the semiconductor layer 103 is locally formed and the regions where the island-like non-transparent layers are formed are selectively heated, which is effective for avoiding the distortion of the substrate 101 in its entirety. To advantageously exert such an effect, the length of one side of the single island-like non-transparent layer 106 is set equal to or smaller than the thickness of the substrate 101, particularly preferably equal to or smaller than 5/1 of the substrate thickness. If one side of the non-transparent layer 106 has the length equal to or larger than the substrate thickness, the distorting force dominantly acts on the substrate to thereby deform the substrate in the end.

Figure 2A:
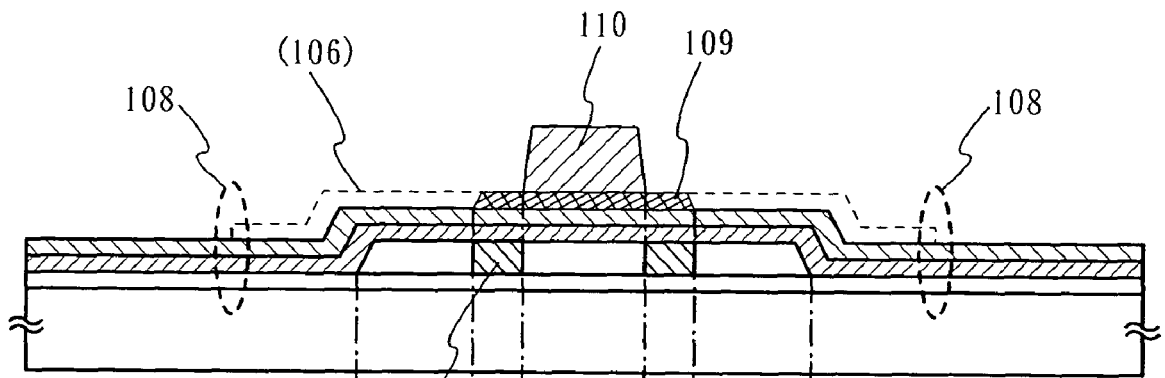
FIGS. 2A and 2B are explanatory views each showing a site where a gate is formed after heat treatment of FIGS. 1A and 1B.
Figure 2B:
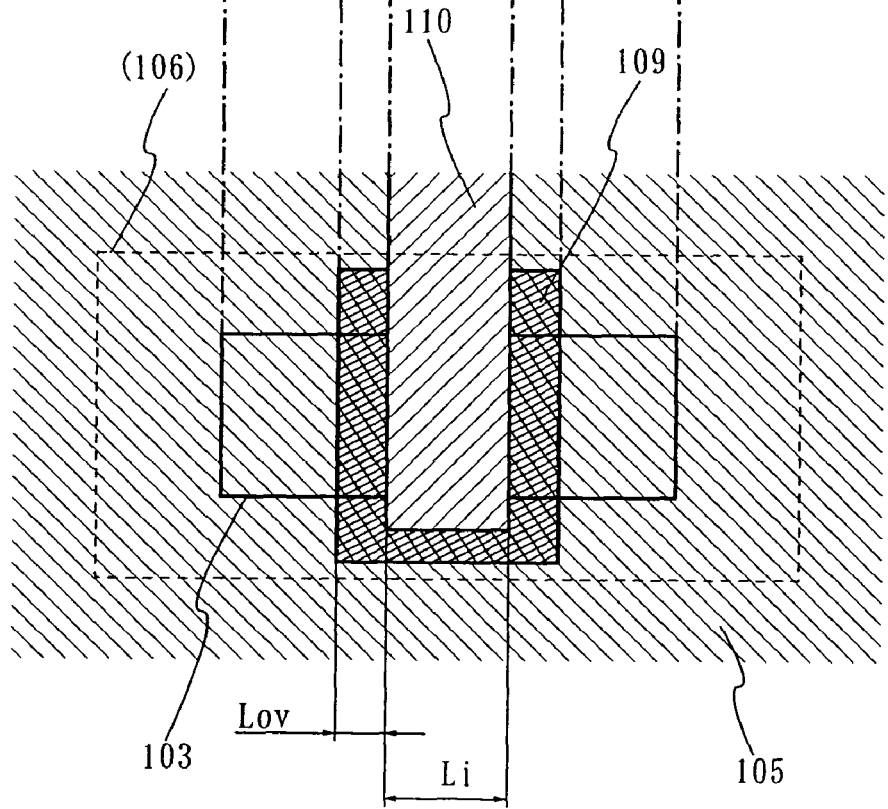

The whole non-transparent layer 106 may be removed after the heat treatment or may be etched into part of wiring or electrode members for the purpose of effective use. FIGS. 2A and 2B each show a case where the non-transparent layer 106 is partially left to constitute part of the gate electrode. The original shape of the non-transparent layer 106 is changed into a desired shape by etching the layer to cut back its ends. The non-transparent layer formed of metal, metal nitride, silicide, or the like exhibits conductivity and is thus formed into the gate electrode after being etched into the desired shape. A second conductive layer 110 may be formed on a first conductive layer 109 formed using the non-transparent layer, thereby achieving a top hat gate electrode as a whole.

The first conductive layer 109 and the second conductive layer 110 constitute the top hat gate electrode. By utilizing the unique shape, the TFT of a gate overlap LDD structure can be formed. This is achieved as follows. That is, the first conductive layer 109 has a thickness different from that of the second conductive layer 110 such that the latter is larger than the former. Accordingly, an ion blocking ability is imparted thereto to form impurity regions 111 overlapping with the first conductive layer 109. FIG. 2B is a top view of this structure. In the gate electrode composed of the first conductive layer 109 and the second conductive layer 110, a channel length (gate length) (Li) is defined according to the length of the second conductive layer 110. Further, a length (Lov) of a gate overlap LDD equals a length of the protruding portion of the first conductive layer 109.

As a preferable mode of the present invention, a gate insulating film is formed of a laminate composed of a silicon oxide film and a silicon nitride film. The silicon oxide film is formed using a silicon target through a radiofrequency (RF) power application in an atmosphere containing oxygen, or oxygen and rare gas, by sputtering. The silicon nitride film is formed using the silicon target through the radiofrequency (RF) power application in an atmosphere containing nitrogen, or nitrogen and rare gas, by sputtering. The laminate is formed through deposition at a substrate heating temperature of 400° C. or lower, preferably 300° C. or lower. By performing the heat treatment at a temperature higher than that the above value after the film formation, it is possible to suppress defect density at a laminate interface or in the film, or distortion. Preferably, the heat treatment is performed at a temperature of 600 to 800° C. As shown in FIGS. 1A and 1B, in the heat treatment, the conductive layers are locally formed on the specific sites on the substrate 101 and the sites are locally heated with a heating time set to 30 to 300 seconds (preferably, 60 to 180 seconds). As a result, even within the above temperature range, the thermally fragile glass substrate with a distortion point of 700° C. or lower can reduce its heat distortion. Thus, it is possible to suppress defect density at the laminate interface or in the film, or distortion.

When the silicon oxide film or silicon nitride film is formed using the silicon target by radiofrequency (RF) sputtering, the principal film formation conditions of the silicon oxide film are as follows: the silicon target is used and sputtering gas contains oxygen, or oxygen and rare gas. The silicon nitride film is formed under the conditions that the silicon target is similarly used and the sputtering gas contains nitrogen, or nitrogen and rare gas. The frequency of the applied radiofrequency (RF) power is typically 13.56 MHz. However, a much higher frequency, for example, a frequency of 27 to 120 MHz may be applied. As the frequency increases, a chemical reaction is more dominantly effected in the film formation mechanism. Accordingly, the formation of the dense film can be expected with less damage on the base. The rare gas used as the sputtering gas is introduced from the backside of the substrate and used for heating the substrate in some cases. The film formation may be performed on the substrate at room temperature instead of particularly heating the substrate. However, in order to achieve higher adhesion with the base, the substrate heated at 100 to 300° C., preferably 150 to 200° C. provides the satisfactory adhesion.

According to applied sputtering of the present invention, the sputtering gas is selected within such a range as to meet a maximum mixture ratio of 1:1 between oxygen or nitrogen and rare gas. In particular, this mechanism differs from the conventional film formation mechanism based on a physical sputtering phenomenon utilizing ion impact in that radical species of oxygen or nitrogen are extensively used for the reaction. In other words, it is conceivable that the chemical film formation mechanism becomes dominant to the physical one from the following characteristics: the radical of oxygen or nitrogen and silicon react with each other on the target surface and the coating film deposited surface.

To elaborate, if a glow discharge plasma is obtained by applying the radiofrequency (RF) power to the target, the chemically highly-active radical among the radicals of oxygen and nitrogen reacts with the silicon even at a low energy to form oxide or nitride. That is, the active radicals of the oxygen or nitrogen dispersed over the target surface react with the silicon to form oxide or nitride. The silicon oxide or silicon nitride keeps a stable form. However, once a hydrogen ion enters the target surface after being accelerated by a sheath electric field, it is sputtered to be discharged to a vapor phase. The silicon oxides or silicon nitrides diffused in the glow discharge plasma undergo the vapor phase reaction even in the plasma and part thereof reach the substrate surface. At the substrate surface, the silicon oxides or silicon nitrides undergo a surface reaction to form a coating film. Also in the surface reaction, any ionic species entering after being accelerated by a potential difference between a plasma potential and a ground potential supposedly assists the reaction.

If a rare gas content in the mixture gas of oxygen or nitrogen and rare gas to be supplied increases, sputtering using a rare gas ion dominantly occurs (i.e., physical sputtering is dominant), so that such a film formation mechanism cannot be realized. It is ideal that the sputtering gas contain an oxygen or nitrogen gas alone. However, this causes a remarkable reduction in film formation rate, so that the sputtering gas is preferably selected within such a range as to meet the maximum mixture ratio of 1:1 between the oxygen or nitrogen gas and rare gas.

Needless to say, there is possibility that the micro aggregation (cluster) of silicon is sputtered to mix into the deposited coating film. The silicon cluster mixed into the silicon oxide film or silicon nitride film serves defectively to trap the charges to thereby cause hysteresis. The heat treatment performed after formation of such coating films through sputtering provides an effective measure for eliminating such defects. That is, the silicon cluster is oxidized or nitrided by supplying the oxygen or nitrogen thereto, which makes it possible to eliminate generation of charge defects. The oxidizing or nitriding reaction is not limited to the reaction with the oxygen or nitrogen supplied from the vapor phase but may be a reaction with excessive oxygen or nitrogen contained in the film.

Also, the silicon oxide film may be formed by the heat treatment at 100 to 600° C. in an oxygen atmosphere at a pressure of 0.1 to 5 MPa, i.e., so-called high-pressure oxidation as well as by RF sputtering. The high-pressure oxidation enables the oxidation of silicon to proceed even at a low temperature. As a result, the dense oxide film compatible with the thermal oxidation film can be formed. The silicon oxide film formed by the above method and the silicon nitride film formed by the RF sputtering constitute a laminate for use in a gate insulating film.

As described above, according to the present invention, RF sputtering using the silicon target and the heat treatment are used in combination, which enables the formation of the dense silicon oxide film and silicon nitride film stable against an extrinsic thermal or electric stress even on the thermally fragile glass substrate at the substrate temperature of 300° C. or lower. The above silicon oxide film and silicon nitride film, or the laminate thereof may be effectively used for the gate insulating film of an insulated gate field effect transistor (IGFET), in particular, a thin film transistor (TFT) formed on the thermally fragile glass substrate. Needless to say, the application of the silicon oxide film and silicon nitride film, or the laminate thereof is not limited to the gate insulating film. They may be applied for the various purposes inclusive of a base insulating film formed between the semiconductor layer and the substrate, an interlayer insulating film for insulating between the wirings, and a protective film for blocking the mixing of the impurities from the outside.

Hereinafter, embodiments of the present invention will be described in detail with reference to the accompanying drawings. Note that in the following description, the same components in the respective drawings are denoted by the same reference symbols and the repetitive description thereof is omitted.

(Embodiment 1)

A description will be made of a mode where heat treatment according to the local heating method of the present invention is applied to the laminate obtained by laminating the silicon oxide film and silicon nitride film formed through RF sputtering by using the silicon target and performing the heat treatment thereon to thereby complete the TFT of the gate overlap LDD structure.

Figure 8A:
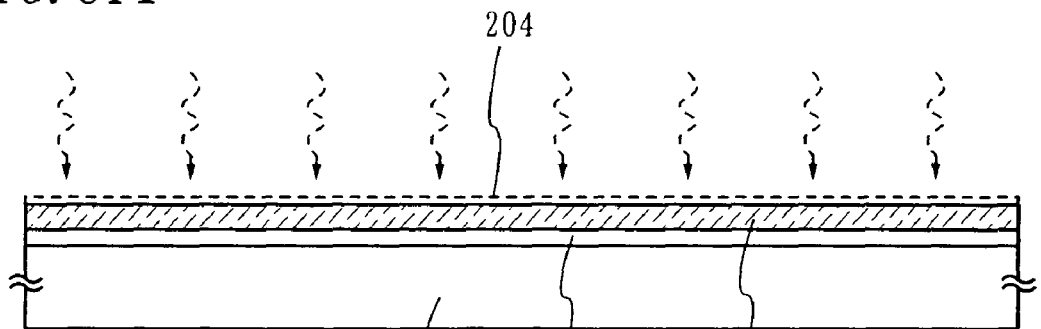
FIGS. 8A to 8C are explanatory views each showing a manufacturing method for a semiconductor device according to the present invention.
Figure 8B:
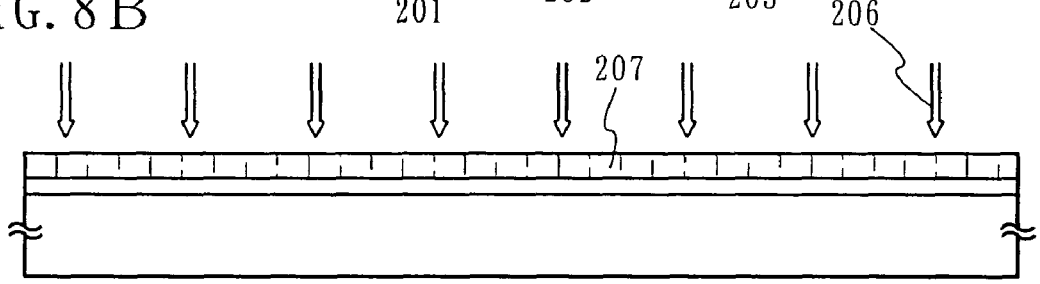
Figure 8C:
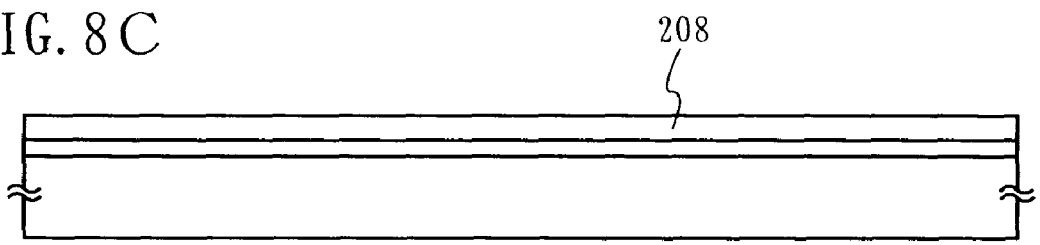

FIGS. 8A to 8C show steps of forming a crystalline silicon film on the glass substrate. As applicable glass for use in a glass substrate 201 according to the present invention, the glass substrate made of barium borosilicate glass, aluminoborosilicate glass, or aluminosilicate glass as a raw material is suitably used. For example, a glass substrate made of Corning #1737 glass (distortion point: 667° C.) and Corning #1737 glass (distortion point: 667° C.) (manufactured by Corning Incorporated) can be used. Needless to say, the similar substrate can be used with no particular limitation and a synthetic quartz substrate having a heat resistance temperature of 1000° C. or higher can be applied thereto. This glass substrate undergoes the heat treatment at 640° C. for 4 hours in the form of raw glass and is cooled down to 450° C. at the rate of 0.2° C./min during the cooling process. The heat treatment makes it possible to suppress the heat contraction of the substrate to a level of 20 ppm or lower with respect to the heat treatment at about 550° C. as the glass distortion point over the subsequent manufacturing steps.

As shown in FIG. 8A, a first insulating film 202 formed of an insulating film such as a silicon oxide film, a silicon nitride film, a silicon oxynitride film (SiO$_x$N$_y$) is formed on the glass substrate 201. Typically, the first insulating film takes a laminate structure composed of a first silicon oxynitride film and a second silicon oxynitride film. The first silicon oxynitride film is formed at the substrate heating temperature of 400° C. by plasma CVD using as a reaction gas, typically, SiH$_4$, NH$_3$, and N$_2$O, in which the nitrogen content is equal to or higher than the oxygen content. The second silicon oxynitride film is formed at the substrate heating temperature of 400° C. by plasma CVD using as the reaction gas SiH$_4$ and N$_2$O, in which the oxygen content exceeds the nitrogen content.

In the above structure, the first silicon oxynitride film may be replaced with the silicon nitride film formed by RF sputtering. Such a silicon nitride film can prevent a minute amount of alkali metal such as sodium (Na) contained in the glass substrate from diffusing thereinto.

The semiconductor layer in which a channel region or source/drain region of the TFT is to be formed can be obtained by crystallizing an amorphous silicon film 203 formed on the first insulating layer 202. The amorphous silicon film formed at the substrate heating temperature of 300° C. by plasma CVD is formed with a thickness of 20 to 60 nm. The upper limit of the film thickness is based on the upper limit imposed on the operation of the silicon film as the complete depletion type channel formation region of the TFT. In addition, the lower limit of the film thickness is based on a limitation in terms of process. An amorphous silicon germanium (Si$_{1-x}$Ge$_x$: x=0.001 to 0.05) film can be substituted for the amorphous silicon film for use in the semiconductor layer.

The film is crystallized by adding a metal element such as nickel (Ni) having a catalytic action on the crystallization of the semiconductor. In FIG. 8A, a nickel-containing layer 204 is held on the amorphous silicon film 203, followed by crystallization through the heat treatment using radiation heating or conductive heating. For example, RTA using the radiation from the lamp as the heat source or RTA (gas RTA) using the heated gas is used and RTA is performed at the preset heating temperature of 740° C. for 180 seconds. The preset heating temperature is a substrate temperature measured by the pyrometer, which is set as the preset temperature at the heat treatment time. As another method, the heat treatment at 550° C. for 4 hours using an annealing furnace is given. This method may be used instead. The action of the metal element having the catalytic action contributes to the reduction in crystallization temperature and time.

A crystalline silicon film 207 is subjected to laser annealing in order to further increase its crystallinity. The laser annealing is performed by irradiating pulse oscillation excimer layer or second harmonic of pulse oscillation laser using crystal such as YAG, YVO$_4$, YLF, or YAlO$_3$, which is doped with Cr, Nd, Er, Ho, Ce, Co, Ti, or Tm. Laser lights 206 emitted from a laser oscillator as a light source are condensed linearly through an optical system to be irradiated for the laser annealing (FIG. 8B).

A crystalline silicon film 208 is thus formed (FIG. 8C). When the pulse laser is irradiated, the levelness of the surface may be impaired to generate a large number of convex portions. For eliminating a large number of convex portions formed on the surface to increase the smoothness thereof, oxidation treatment with an ozone water-containing aqueous solution and process for removing the oxide film using a hydrofluoric acid-containing aqueous solution are performed once, preferably repeatedly performed plural times. In order to form the TFT with a channel length of 0.35 to 2.5 µm, the thickness of the gate insulating film is set substantially to 20 to 80 nm and a maximum size of the concave and convex portions is set to 10 nm or smaller, preferably 5 nm or smaller regarding the smoothness of the crystalline silicon film surface.

Figure 9:
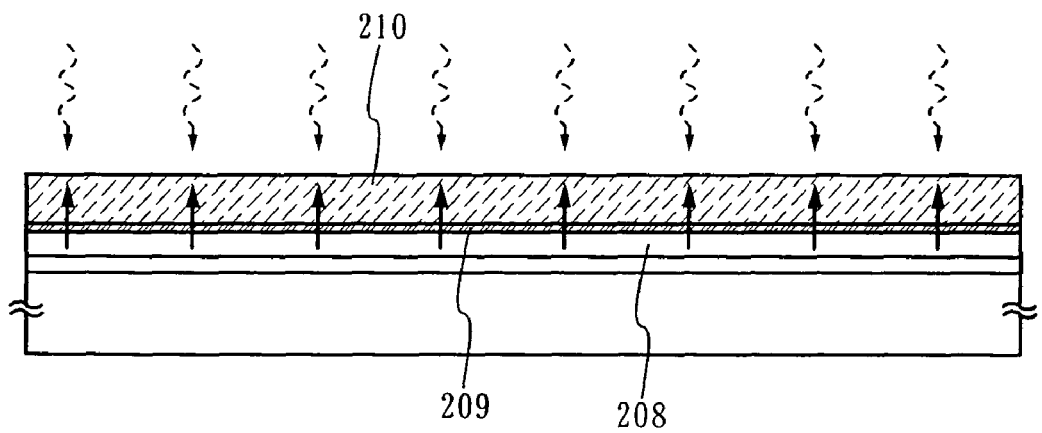
FIG. 9 is an explanatory view showing a manufacturing method for a semiconductor device according to the present invention.

FIG. 9 shows a gettering process, which is performed for removing the impurity such as metal contained in the crystalline silicon film. In particular, gettering is effective for suppressing the concentration of the metal down to 1×10$^{17}$/cm$^3$ or lower. The metal with a catalytic action has been intentionally added in the crystallization step. When the crystalline silicon film formed into a thin film undergoes gettering, a gettering site should be newly formed. In FIG. 9, a barrier layer 209 is formed on a crystalline silicon film 208 and an amorphous silicon film 210 is formed thereon with the barrier layer interposed between the amorphous silicon film and the crystalline silicon film. Thus, the gettering site is formed. The amorphous silicon film 210 contains an impurity element such as phosphorous or boron, a rare gas element such as Ar, Kr, or Xe, oxygen, nitrogen, etc., in a concentration of 1×10$^{20}$/cm$^3$ or more to thereby form a strain field. As a preferable forming method, the amorphous silicon film is formed through RF sputtering by using as sputtering gas argon (Ar). The substrate heating temperature at the film formation time may be arbitrarily set and sufficiently, set to 150° C., for example.

The heat treatment is performed using the radiation heating or conductive heating. For example, RTA using the lamp as the heat source or RTA (gas RTA) using the heated gas is used and RTA is performed at 750° C. for 180 seconds. Alternatively, the heat treatment at 550° C. for 4 hours using the annealing furnace is performed. The heat treatment causes the metal elements to segregate toward the amorphous silicon film 210 side. As a result, the crystalline silicon film 208 achieves a high purity. After the heat treatment, the amorphous silicon film 210 is removed by dry etching using NF$_3$ or CF$_4$ or dry etching using ClF$_3$ without using a plasma, or wet etching using an alkali solution, for example, aqueous solution containing hydrazine or tetraethyl ammonium hydroxide (chemical formula: (CH$_3$)$_4$NOH). Also, the barrier layer 209 is removed through etching using hydrofluoric acid.

After that, the thus obtained crystalline silicon film 208 is etched into a desired shape through photolithography and divided into island-like portions. A semiconductor layer 212 shown in FIG. 10A is thus formed and constitutes a main structural part where the channel region or source/drain region of the TFT is formed. An impurity element imparting a p-type conductivity and that imparting an n-type conductivity are added to the semiconductor layer 212 in order to shift a threshold voltage to a positive value and a negative value, respectively.

Subsequently, a silicon oxide film 214 and a silicon nitride film 215 used for forming a gate insulating film are formed on the semiconductor layer 212 by RF sputtering, followed by the heat treatment utilizing RTA within the same apparatus without exposing the resultant to the air.

Prior to the film formation by sputtering, the following are performed. That is, in order to clean the surface of the semiconductor layer 212, the oxidation treatment with the ozone water-containing aqueous solution is performed. In addition, the process for removing the oxide film using the hydrofluoric acid-containing aqueous solution is performed to thereby etch the surface of the semiconductor layer 212 and terminate dangling bonds at the surface with hydrogen to obtain an inert state. Following this, the silicon oxide film is formed with a thickness of 10 to 60 nm by RF sputtering using a silicon target (doped with boron (B): 1 to 10 Ωcm). Typical film formation conditions are as follows: the sputtering gas contains O$_2$ and Ar with a mixture ratio (flow rate) of 1:3; a pressure at the time of sputtering is 0.4 Pa; a discharge power is 4.1 W/cm² (13.56 MHz); and the substrate heating temperature is 200° C. Under such conditions, a dense silicon oxide film 213 can be formed with a low interface level density with the semiconductor layer. Also, prior to the deposition of the silicon oxide film, the surface treatment such as heat treatment or oxygen plasma treatment under the reduced pressure may be performed inside a preheating chamber 103. If the surface is oxidized by the oxygen plasma treatment, the interface level density can be lowered. After that, the silicon nitride film 214 is formed with a thickness of 10 to 30 nm by RF sputtering. Typical film formation conditions are as follows: the sputtering gas contains $N_2$ and Ar with a mixture ratio (flow rate) of 1:1; a pressure at the time of sputtering is 0.8 Pa; a discharge power is 4.1 W/cm² (13.56 MHz); and the substrate heating temperature is 200° C.

The gate insulating film of the laminate structure can substantially provide the same effects as the time when the film is thinned. This is because a specific dielectric constant of the silicon oxide is 3.8, whereas the specific dielectric constant of the silicon nitride is about 7.5. Considering the smoothness of the semiconductor layer surface, the maximum size of the concave and convex portions is set to 10 nm or smaller, preferably 5 nm or smaller. The gate insulating film takes a two-layer structure composed of the silicon oxide film and the silicon nitride film. Thus, even if the total thickness of gate insulating film is set to 30 to 80 nm, it is possible to reduce a gate leak current and to drive the TFT at 2.5 to 10V, typically 3.0 to 5.5V.

The laminate composed of the silicon oxide film 213 and the silicon nitride film 214 is formed before a non-transparent layer 215 is formed. The non-transparent layer 215 is formed of a material selected from the group consisting of: high melting-point metal such as molybdenum (Mo), tungsten (W), or titanium (Ti); metal nitride such as titanium nitride, tantalum nitride, or tungsten nitride; silicide such as tungsten silicide ($WSi_2$), molybdenum silicide ($MoSi_2$), titanium silicide ($TiSi_2$), tantalum silicide ($TaSi_2$), chromium silicide ($CrSi_2$), cobalt silicide ($CoSi_2$), or platinum silicide ($PtSi_2$); and polycrystalline silicon doped with phosphorous or boron.

The thickness of the non-transparent layer 215 is set to 10 to 100 nm, preferably 20 to 50 nm. In the case where the non-transparent layer 215 has a thickness of less than 10 nm, the radiation from the heat source cannot be absorbed sufficiently. On the other hand, when the non-transparent layer 215 has a thickness of more than 100 nm, the semiconductor layer side is not heated sufficiently. Accordingly, it is preferable to adopt the value in the above range.

As shown in FIG. 10B, the heat treatment using as a heat source 216 the tungsten halogen lamp is performed at this stage, in a nitrogen atmosphere at 600 to 800° C. for 30 to 300 seconds, preferably at 700 to 760° C. for 30 to 180 seconds. The region of the substrate 201 on which the non-transparent layer 215 is formed to absorb the radiation from the heat source 216 can withstand the heat treatment as compared with the other regions, which enables local heating. This treatment oxides or nitrides the micro silicon cluster mixed into the film and eases internal strain to thereby reduce the defect density in the film or interface level defect density.

After that, as shown in FIG. 10C, as a second conductive layer 217, an element selected from the group consisting of tantalum (Ta), tungsten (W), titanium (Ti), molybdenum (Mo), aluminum (Al), and copper (Cu), or an alloy material or compound material mainly containing the metal element is deposited into a film. A conductive film 215 and a second conductive layer 217 are processed into a gate electrode. A preferable combination therefor is a combination of the first conductive film 215 made of a tantalum nitride (TaN) film and the second conductive film 217 made of tungsten (W); or a combination of the first conductive film 215 made of a tantalum nitride (TaN) film and the second conductive film 217 made of a titanium (Ti) film.

Figure 11A:
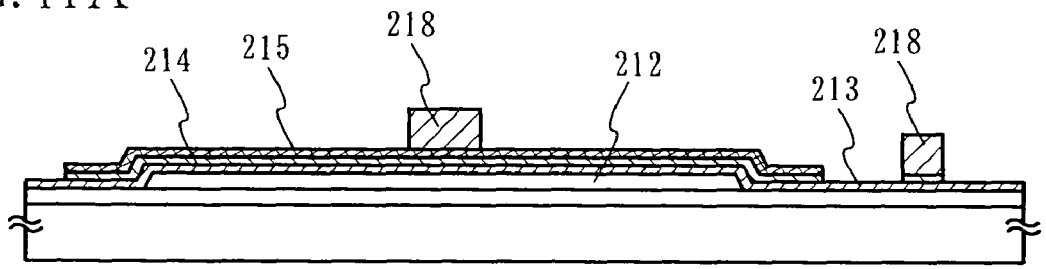
FIGS. 11A to 11E are explanatory views each showing a manufacturing method for a semiconductor device according to the present invention.
Figure 11B:
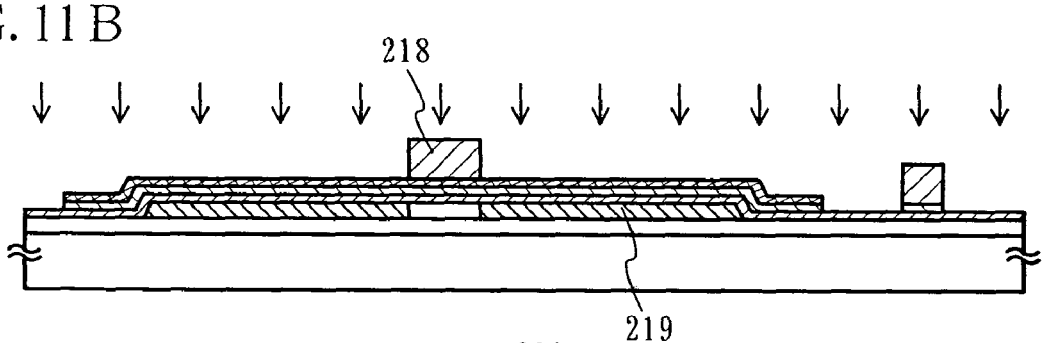

Next, as shown in FIG. 11A, the second conductive film 218 is etched according to a gate electrode pattern to form a second conductive layer 218 on the non-transparent layer 215. Following this, the second conductive layer 218 serves as a mask for doping one conductivity type impurity, which passes through the non-transparent layer 215 and is injected into the semiconductor layer 212 to thereby form first impurity regions 219 (FIG. 11B).

Figure 11C:
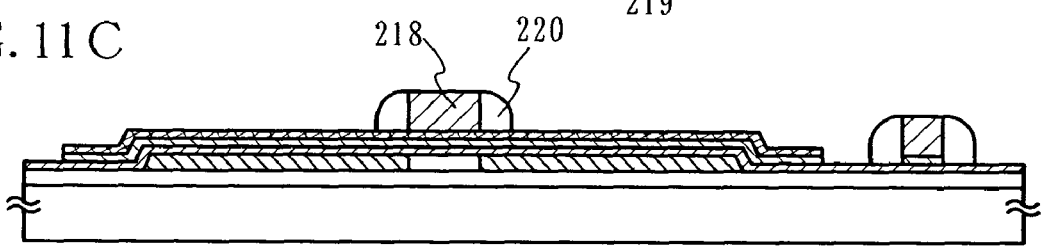
Figure 11D:
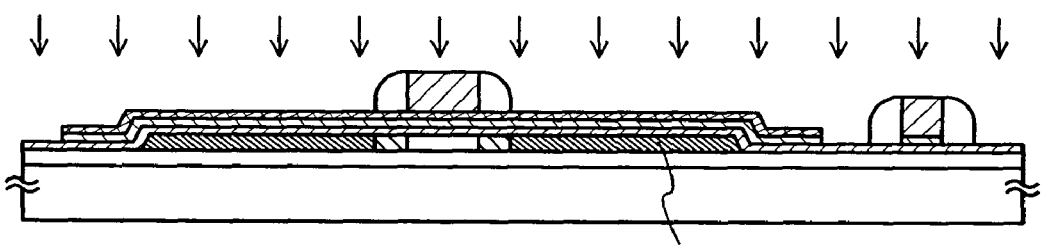

Next, an insulating layer made of a silicon oxide film is formed on the second conductive layer 218 and the non-transparent layer 215 and a side spacer 220 is formed by anisotropic etching (FIG. 11C). The side spacer 220 and the second conductive layer 218 are used as the mask at the doping time. Second impurity regions 221 doped with the one conductivity type impurity which passes through the non-transparent layer 215 are formed in a self-alignment manner (FIG. 11D).

Regarding the one conductivity type impurity, in the case of an n-type impurity (donor), an element such as phosphorous or arsenic belonging to Group 15 in the periodic table is used, whereas in the case of a p-type impurity (acceptor), an element such as boron belonging to Group 13 in the periodic table is used. By appropriately selecting the impurities, an n-channel or p-channel TFT can be formed. Also, the n-channel TFT and the p-channel TFT can be integrated onto the same substrate easily by using the additional mask patterns for the doping.

Figure 11E:
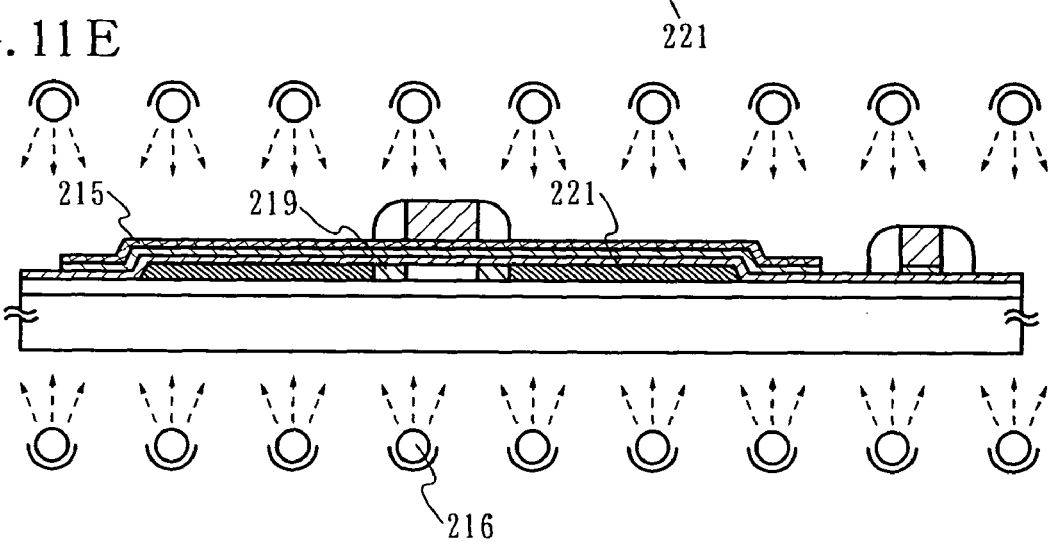

As shown in FIG. 11E, the heat treatment based on the local heating is performed using the tungsten halogen lamp as the heat source once more, in a nitrogen atmosphere at 600 to 800° C. for 60 to 300 seconds, preferably at 650 to 760° C. for 60 to 180 seconds. The conductive layer 215 absorbs the radiation from the heat source 216. Therefore, in each second impurity region 212 formed in the semiconductor layer 212, the activation of the impurity proceeds to thereby achieve the low resistance.

Figure 12A:
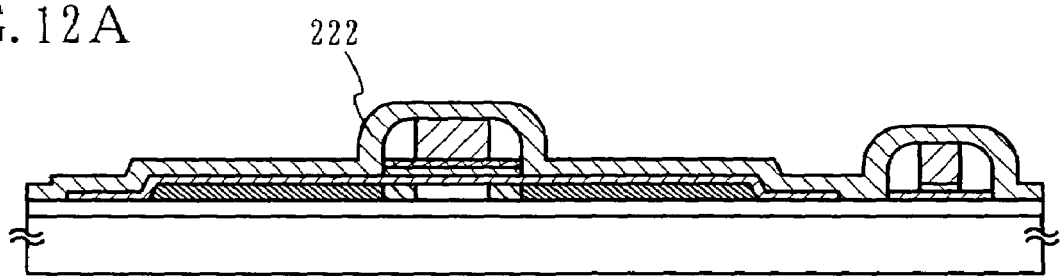
FIGS. 12A and 12B are explanatory views each showing a manufacturing method for a semiconductor device according to the present invention.

After that, the second conductive layer 218 and the side spacer 220 serve as a mask for etching the non-transparent layer 215. A silicon oxynitride film containing hydrogen is formed as a third insulating layer 222 using a mixture gas of $SiH_4$, $N_2O$, $NH_3$, and $H_2$, by plasma CVD at the substrate heating temperature of 250 to 350° C. The film thickness is set to 50 to 200 nm. After the film formation, the semiconductor layer is hydrogenated with the heat treatment at 410° C. in a nitrogen atmosphere (FIG. 12A).

Figure 12B:
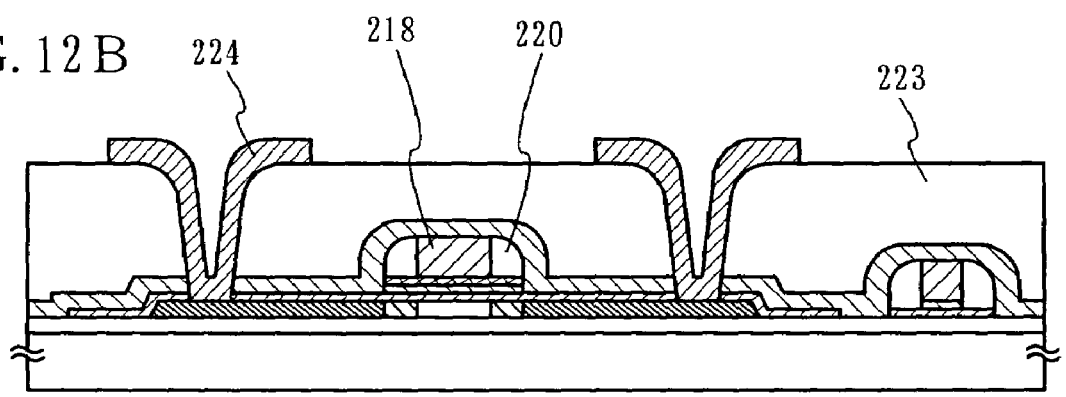

Further, a fifth insulating layer 233 is formed of a photosensitive or non-photosensitive organic resin material mainly containing acryl, polyimide, or the like. A wiring 234 formed of a conductive material such as Al, Ti, Mo, or W is formed in accordance with each contact hole formed in the third to fifth insulating layers. By forming the fifth insulating layer using the organic resin material, the capacitance between the wirings is reduced and the smooth surface is achieved. As a result, the high-density arrangement of the wirings can be realized on the layer (FIG. 12B).

In this way, the TFT of the gate overlap LDD structure is completed. According to the steps in this embodiment, through the heat treatment necessary of the step of forming a gate portion of the TFT, the portion where the semiconductor layer is formed is heated uniformly, but the other portions are less heated to involve no contraction of the glass substrate. Thus, accuracy in size of the gate portion and its vicinity is secured. The TFT with a channel length of 0.3 to 1.5 μm can be formed on the glass substrate. By applying the laminate to the gate insulating film of the TFT, the TFT exhibiting less variation in threshold voltage or subthreshold characteristic can be obtained. The laminate is obtained by laminating the silicon oxide film and the silicon nitride film formed by RF sputtering using the silicon target and performing the heat treatment such that the resulting product is locally heated using a conductive layer formed through pattern lithography. That is, the gate insulating film can be formed of the dense silicon oxide film containing neither hydrogen nor fixed charge due to the heat treatment or the laminate including the silicon oxide film and the silicon nitride film, which can contribute to the realization of the stable 1F characteristics.

(Embodiment 2)

Figure 13:
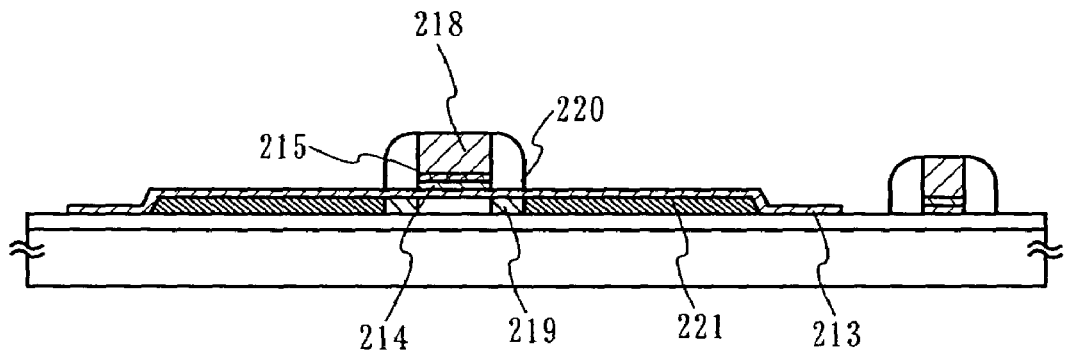
FIG. 13 is an explanatory view showing a manufacturing method for a semiconductor device according to the present invention.

A description will be made of a mode where heat treatment according to the local heating method of the present invention is applied to the laminate obtained by laminating the silicon oxide film and silicon nitride film formed through RF sputtering by using the silicon target and performing the heat treatment thereon to thereby complete the TFT of the gate overlap LDD structure. Referring to FIG. 13, this embodiment will be described.

Similarly to Embodiment 1, the steps shown in FIGS. 8A to 11A are conducted. After that, as shown in FIG. 13, the second conductive layer 218 serves as the mask for etching and removing the non-transparent layer 215. A portion of the non-transparent layer overlapping with the second conductive layer 218 is unetched to remain there. The non-transparent layer 215 formed of metal, metal nitride, silicide, etc., is etched by using as an etching gas $CF_4$ or $Cl_2$. At this time, the silicon nitride film 214 and the silicon oxide film 213 as lower layers are simultaneously etched in some cases. However, in this embodiment, the change in shapes of the silicon nitride film and the silicon oxide film gives no influence. Etching may be performed such that the semiconductor layer 212 is exposed. Further, as shown in FIG. 13, the silicon oxide film may remain on the semiconductor layer 212. In this state, the first impurity regions 219 are formed. The second impurity regions 221 are formed after the side spacer 220 is formed at each side wall portion of the gate electrode. In this step, the non-transparent layer is removed before the doping process, so that no impurity region overlapping with the gate electrode is formed. Thus, the LDD structure can be formed.

If the subsequent steps are performed in the same way as Embodiment 1, the TFT of the LDD structure is completed. In addition, by using the steps of this embodiment and the steps of Embodiment 1 in combination, the TFT of the gate overlap LDD structure and the TFT of the LDD structure can be manufactured, the TFTs coexisting on the same substrate.

(Embodiment 3)

In this embodiment, a mode in which the TFT of the gate overlap LDD structure is manufactured through the steps different from the steps of Embodiment 1 will be shown.

Figure 14A:
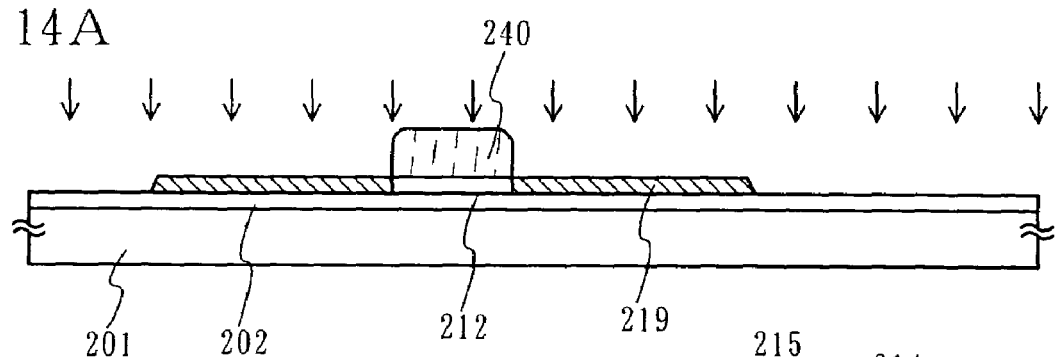
FIGS. 14A to 14D are explanatory views each showing a manufacturing method for a semiconductor device according to the present invention.

In FIG. 14A, the first insulating layer 202 and the semiconductor layer 212 are formed on the substrate 201 and a mask 240 is formed thereon, followed by the doping process. Thus, the first impurity regions 219 are formed.

Figure 14B:

The mask 240 is peeled off and the organic contaminant is removed through cyclic washing alternatively using the ozone water and the hydrofluoric acid and ultraviolet (UV) ozone treatment to thereby form a clean surface. Following this, the silicon oxide film 213, the silicon nitride film 214, and the non-transparent layer 215 are formed thereon (FIG. 14B).

Figure 14C:
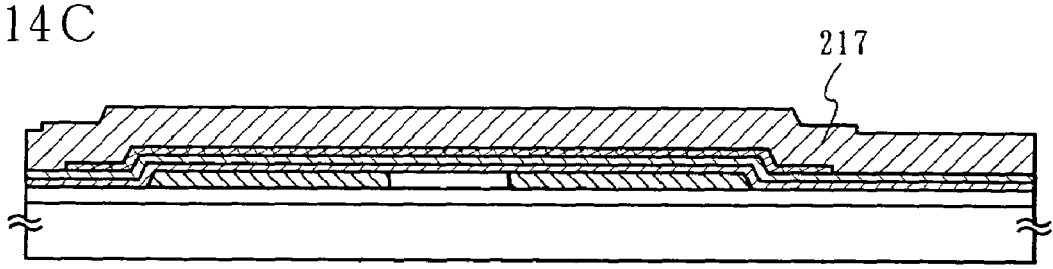
Figure 14D:
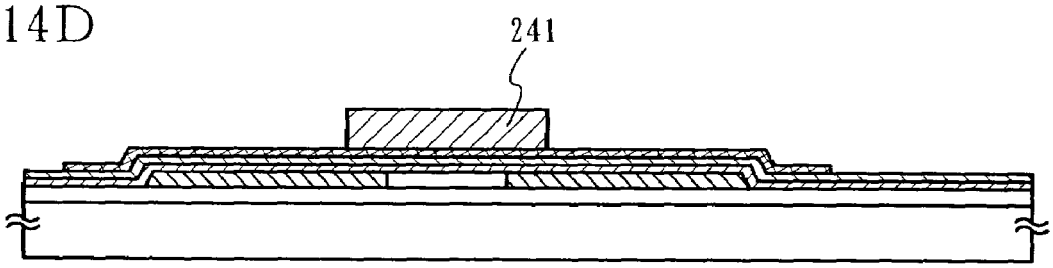

After that, the second conductive layer 217 is formed (FIG. 14C), which is then etched into a second conductive layer 241 according to a gate electrode pattern. The gate electrode is formed at a position according to a position where the mask 240 is formed while overlapping with each first impurity region 219, thereby forming the gate overlap structure at this stage (FIG. 14D).

Figure 15A:
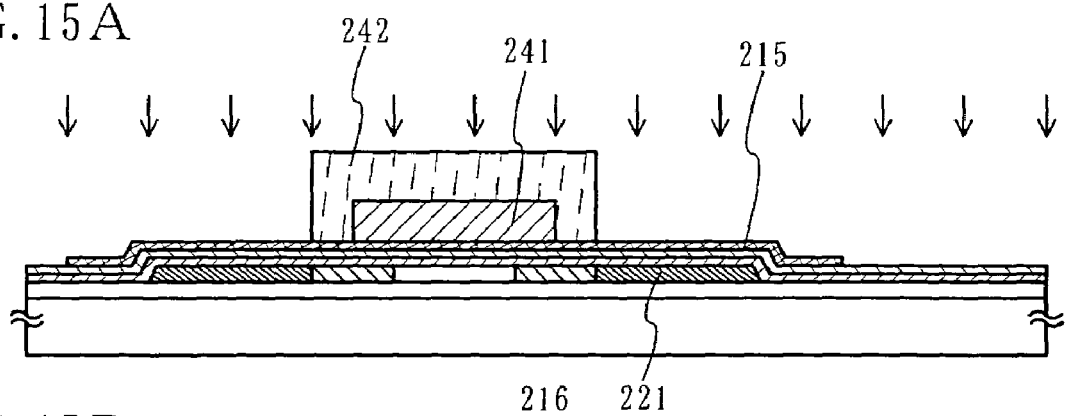
FIGS. 15A to 15C are explanatory views each showing a manufacturing method for a semiconductor device according to the present invention.

Next, as shown in FIG. 15A, a mask 242 is formed on the second conductive layer 241. The mask 242 covers the second conductive layer 241 and at the same time, extends over the semiconductor layer 212 by a length of each LDD region overlapping with no gate electrode. In this state, doping is conducted using the mask 242 to thereby form second impurity regions 221.

Figure 15B:
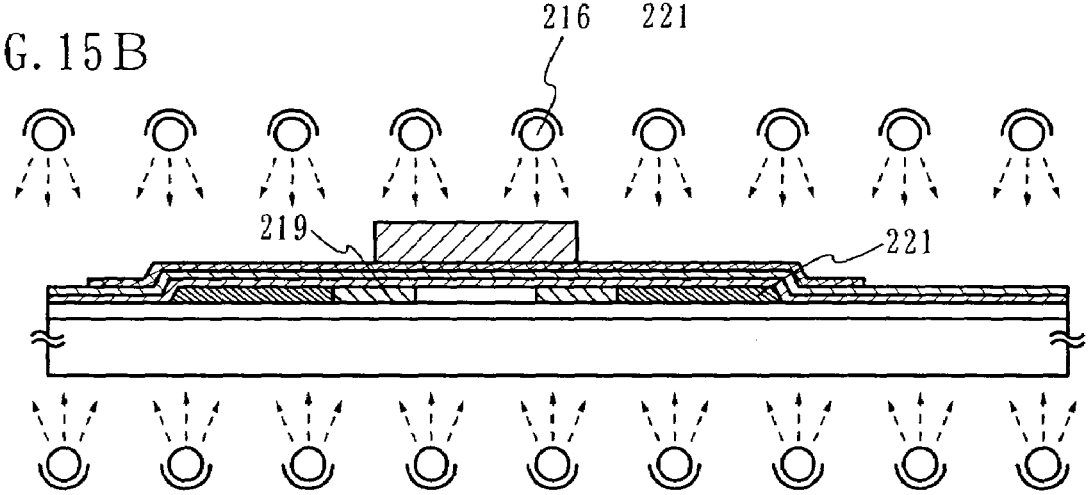
Figure 15C:
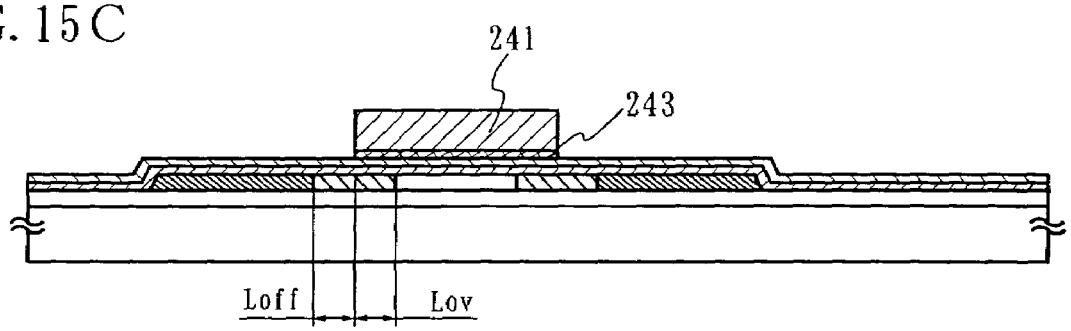

Subsequently, the heat treatment is performed using RTA for the purpose of achieving the activation of each first impurity region 219 and each second impurity region 221 and the modification of the gate insulating film (FIG. 15B). RTA is performed at 700 to 800° C. for 30 to 300 seconds. In this case, the non-transparent layer 215 absorbs the radiation from the heat source to thereby enable local heating. Through the heat treatment, both of the modification of the gate insulating film and the activation of each first impurity region 219 and each second impurity region 221 can be achieved at a time. In particular, RTA increases a heat treatment effect on each first impurity region overlapping with the gate electrode to enhance an activation rate and also to modify a junction interface with the channel formation region. Thereafter, the non-transparent layer 215 is etched to form a gate electrode composed of the non-transparent layer 243 and the second conductive layer 241 (FIG. 15C).

In the steps of this embodiment, the heat treatment using RTA is performed only once to achieve the activation of the first and second impurity regions and the modification of the gate insulating film. The subsequent steps are conducted similarly to those of Embodiment 1, thereby completing the TFT of a partial gate overlap LDD structure where a part of each LDD region overlaps with the gate electrode (Lov) and another part thereof overlaps with no gate electrode (Loff).

(Embodiment 4)

Figure 16A:
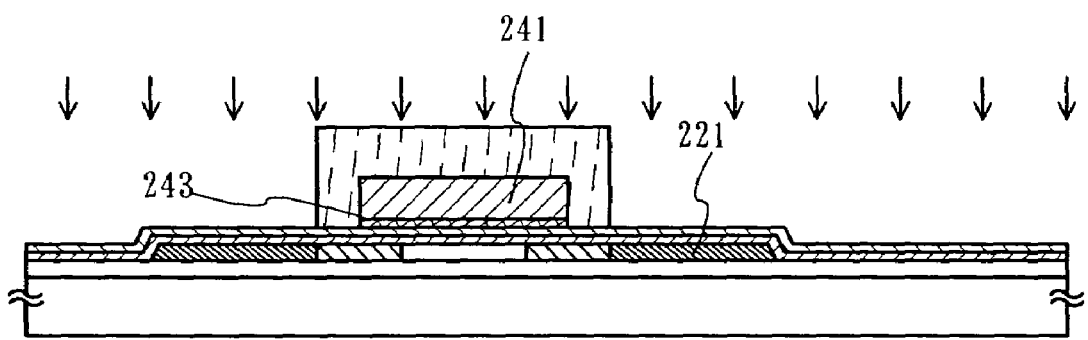
FIGS. 16A and 16B are explanatory views each showing a manufacturing method for a semiconductor device according to the present invention.

In Embodiment 3, after the steps up to that shown in FIG. 14D are similarly performed, as shown in FIG. 16A, the non-transparent layer 215 is etched. Thus, at this stage, the gate electrode composed of the non-transparent layer 215 and the second conductive layer 241 is formed. Thereafter, the mask 242 is formed for doping to thereby form the second impurity regions 221.

Figure 16B:
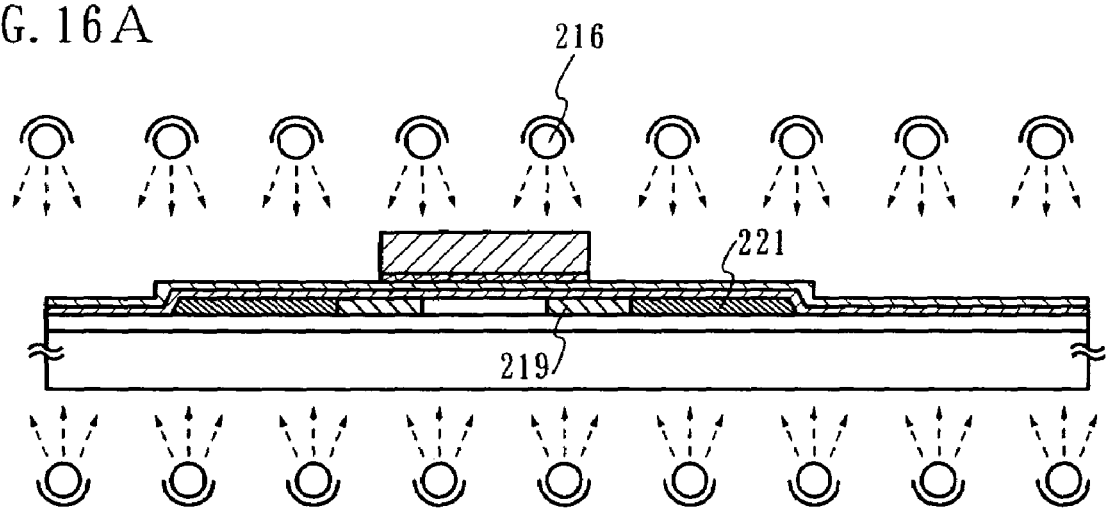

After that, as shown in FIG. 16B, the heat treatment based on local heating using RTA is performed for the modification of the gate insulating film and the activation of each first impurity region 219. Thus, the same effects can be obtained. If each second impurity region 221 is not sufficiently activated, the heat treatment may be carried out in combination with laser annealing.

(Embodiment 5)

In Embodiment 1, after the steps up to that shown in FIG. 10C are carried out, the step of etching the gate electrode can be performed under the other conditions.

Figure 20A:
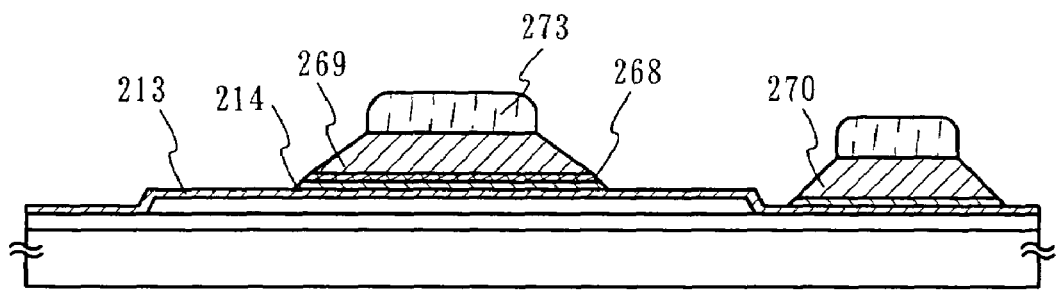
FIGS. 20A to 20E are explanatory views each showing a manufacturing method for a semiconductor device according to the present invention.

Subsequently, as shown in FIG. 20A, a resist mask is formed for forming a gate electrode pattern and then, a first etching process is conducted through dry etching. An inductively coupled plasma (ICP) etching method is adapted for etching. There is imposed no limitation on an etching gas, but $CF_4$, $Cl_2$, and $O_2$ are used for etching a film made of tungsten (W) or tantalum nitride (TaN). In the first etching process, a predetermined bias voltage is applied to the substrate side to incline both sides of first-shape gate electrode patterns 268 and 269 to be formed at an angle of 15 to 50 degrees. Although depending on the etching conditions, the silicon nitride film 214 formed as the gate insulating film by the first etching process remains under the first-shape gate electrode patterns 268 and 269 to expose the silicon oxide film 213.

After that, the etching conditions are shifted to second etching conditions. The etching gas is changed to $SF_6$, $Cl_2$, and $O_2$ and the bias voltage applied to the substrate side is set to a predetermined value. Then, the tungsten (W) film undergoes anisotropic etching. Thus, the gate electrode is formed, which has a two-layer structure composed of the conductive layer 268 and a second conductive layer 275 (FIG. 20B).

Figure 20B:
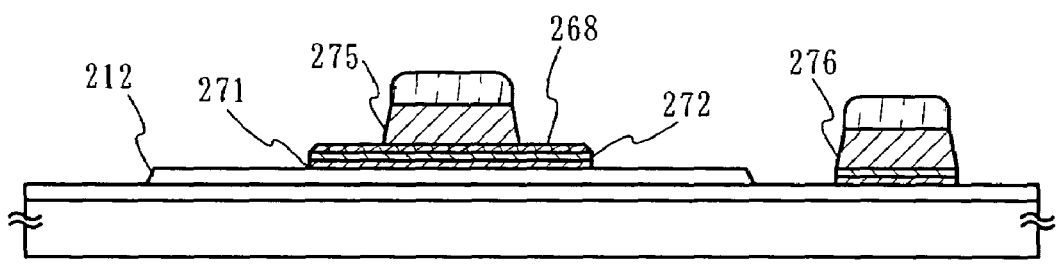
Figure 21A:
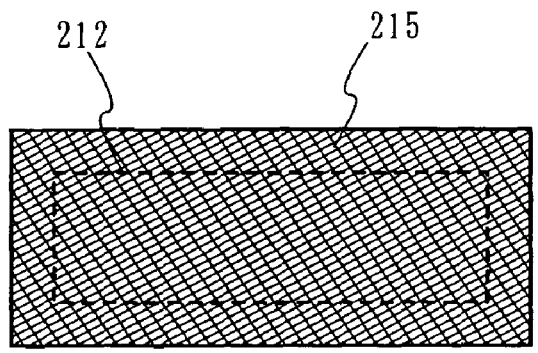
FIGS. 21A to 21C are explanatory views each showing a manufacturing method for a semiconductor device according to the present invention.
Figure 21B:
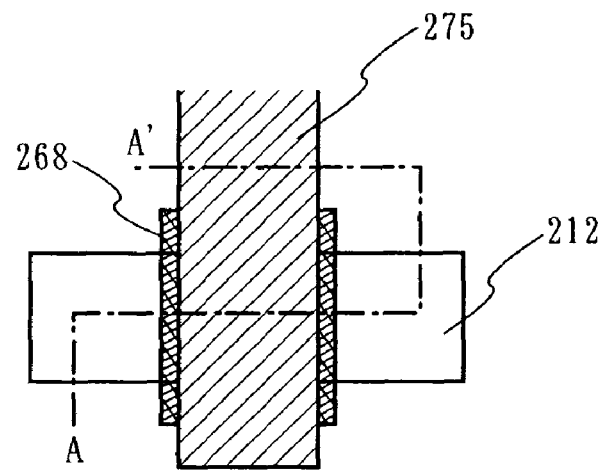
Figure 21C:
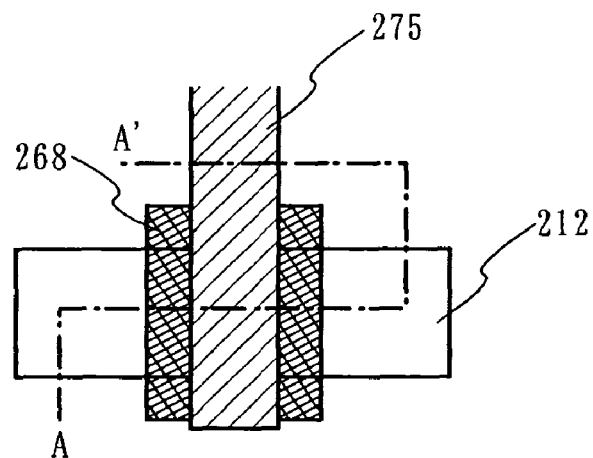

Note that in the steps shown in FIGS. 20A and 20B, wirings 270 and 276 are formed using the same layer as the second conductive layer. Therefore, as apparent from the comparison with top views of FIGS. 21B and 21C, the wirings can be formed in succession to the gate electrode.

Figure 20C:
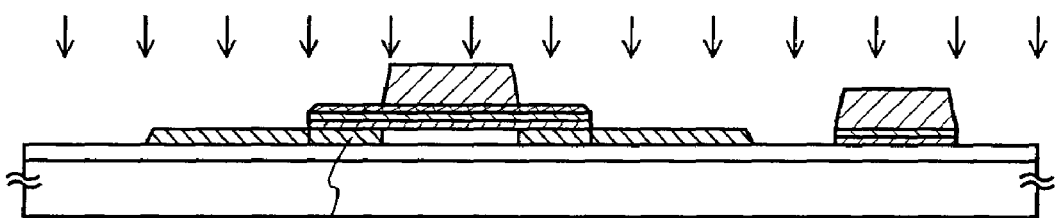
Figure 20D:
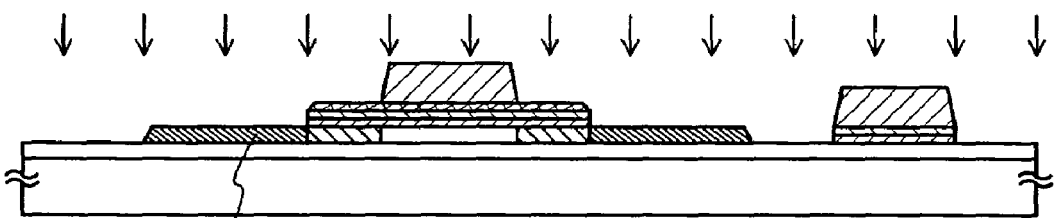
Figure 20E:
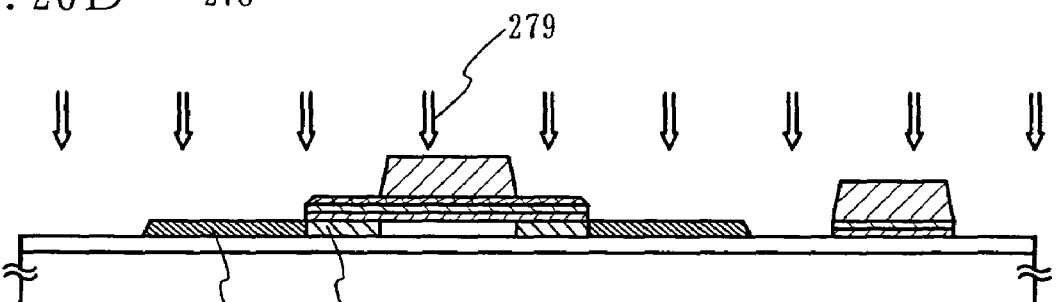

The gate electrode constitutes a laminate structure composed of the conductive layer 268 and the second conductive layer 275. As viewed in section, the gate electrode takes a structure (top-hat structure) in which the conductive layer 268 protrudes outwardly like a peak. Then, as shown in FIG. 20C, doping is performed thereon. According to the doping method including accelerating the impurity ions for controlling valences owing to the electric field and injecting the ions, it is also possible to vary impurity concentrations among impurity regions to be formed in the semiconductor layer 212 by appropriately adjusting an acceleration voltage of the ions. In other words, the impurity ions of one conductivity type are injected at the acceleration voltage high enough to allow the ions to pass through the peak portion of the conductive layer 268, thereby forming first impurity regions 277 overlapping with the gate electrode. Thereafter, as shown in FIG. 20D, the impurity ions of one conductivity type are injected at the acceleration voltage low enough to prevent the ions from passing through the peak portion of the conductive layer 268, thereby forming second impurity regions 278. Through such a doping method, the TFT having a so-called gate overlap LDD structure can be formed.

Regarding the one conductivity type impurity, in the case of an n-type impurity (donor), an element such as phosphorous or arsenic belonging to Group 15 in the periodic table is used, whereas in the case of a p-type impurity (acceptor), an element such as boron belonging to Group 13 in the periodic table is used. By appropriately selecting the impurities, an n-channel or p-channel TFT can be formed. Also, the n-channel TFT and the p-channel TFT can be easily integrated onto the same substrate by solely using the additional mask patterns for the doping.

The activation of each second impurity region 278 where the source/drain region is to be formed and each first impurity region 277 where the LDD region is to be formed is achieved by laser annealing through the irradiation of a pulse laser or continuous wave (CW) laser 279. It is possible to activate the above regions by furnace annealing capable of heating at 500° C. or higher. After the position of the gate is determined, however, it is preferable to prevent the substrate 201 from contracting through heating, which may affect the mask alignment in the subsequent step. Accordingly, at this stage, laser annealing is suitably adopted since the activation can be performed without heating the substrate 201. In particular, the accuracy in size of the pattern should be secured by using laser annealing in order to process the regions with the channel length set to 0.3 to 1.5 μm.

Figure 22A:
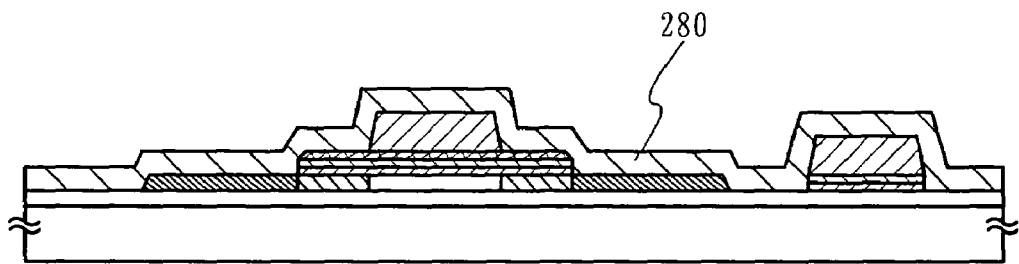
FIGS. 22A and 22B are explanatory views each showing a manufacturing method for a semiconductor device according to the present invention.

As shown in FIG. 22A, a silicon oxynitride film containing hydrogen is formed as a third insulating layer 280 by plasma CVD using a mixture gas of $SiH_4$, $NH_3$, $N_2O$, and $H_2$ at the substrate heating temperature of 325° C. The film thickness is set to 50 to 200 nm. Thereafter, the semiconductor layer is hydrogenated by the heat treatment in a nitrogen atmosphere at 410° C.

Figure 22B:
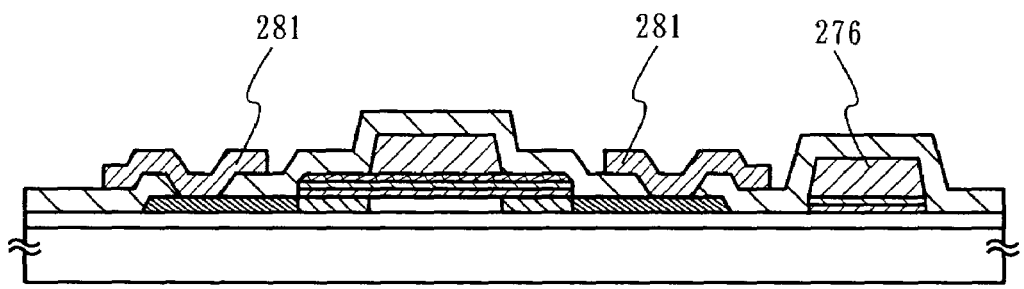

After that, contact holes are formed in the third insulating layer 280 and wirings 281 are formed of Al, Ti, Mo, W, etc., as appropriate. Given as an example of a wiring structure is a laminate structure composed of a Ti film with a thickness of 50 to 250 nm and an alloy film (Al—Ti alloy film) with a thickness of 300 to 500 nm (FIG. 22B).

Figure 24:
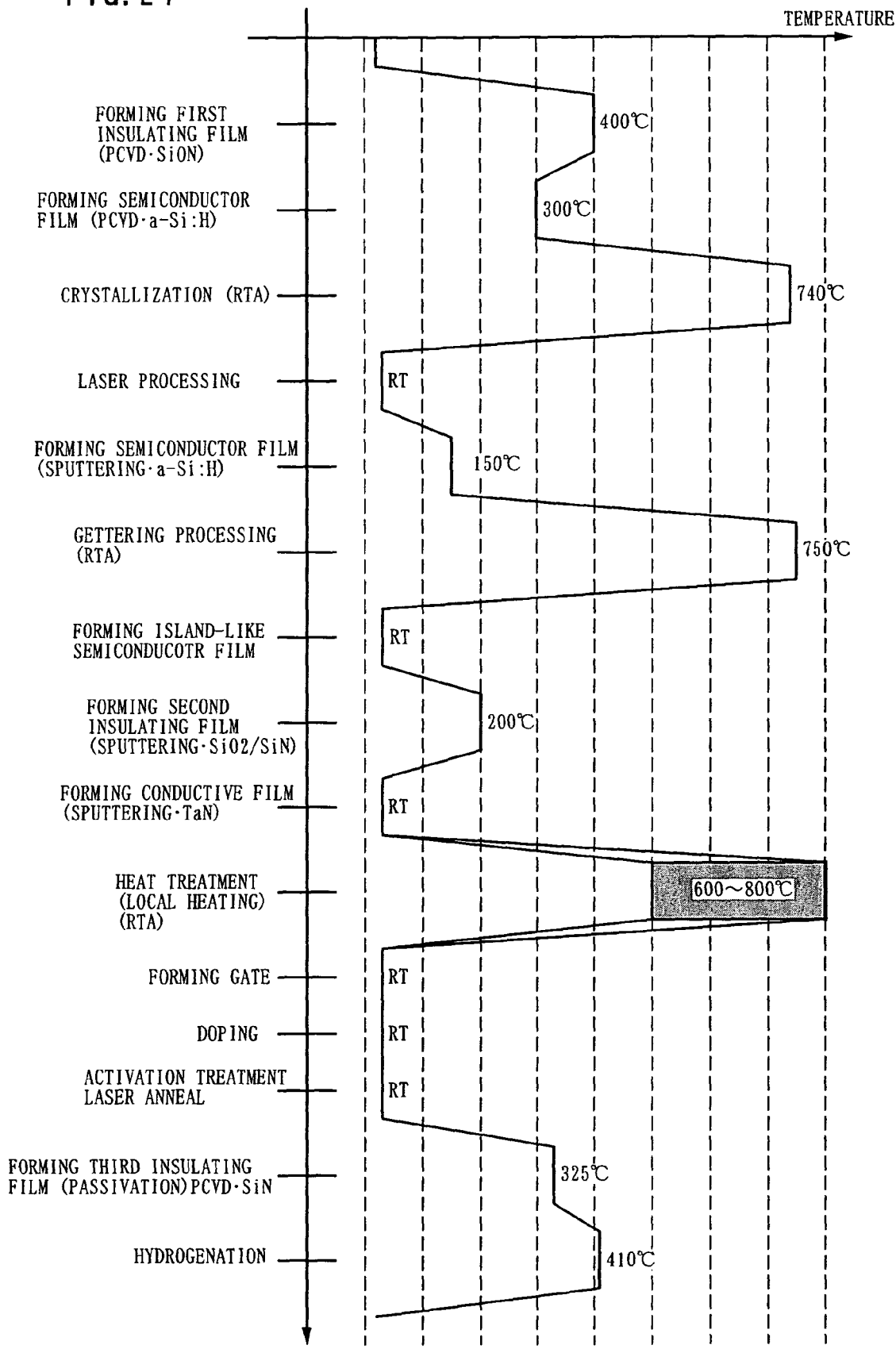
FIG. 24 is a graph focusing on a heating temperature of a substrate in a process according to Embodiment 1 of the present invention and showing a transition thereof.

FIG. 24 is a graph focusing on the substrate heating temperature and showing a transition thereof. The steps of this embodiment involve RTA for the heat treatment performed for the purpose of the crystallization and gettering of the amorphous silicon film and the heat treatment based on the local heating. In the above heat treatments, the maximum temperature exceeds 700° C. Although RTA enables rapid heating at a rate of 100° C./sec, the glass substrate inevitably contracts through the above heat treatments. However, focusing on the step of forming the island-like semiconductor layer on the substrate and its subsequent steps, only the heat treatment based on the local heating performed for the purpose of modifying the gate insulating film is required, so that the substrate is less likely to contract. As a result, the change in size of the pattern can be minimized.

In other words, according to the steps of this embodiment, the heat treatment required for the step of forming the gate portion of the TFT is performed such that the portion where the semiconductor layer is formed is uniformly heated, whereas the other portions are less heated. Thus, the substrate does not contract. Accordingly, the accuracy in size of the gate portion and its vicinity is secured and the TFT with a channel length of 0.3 to 1.5 μm can be formed on the glass substrate.

In this way, the TFT of the gate overlap LDD structure is completed. By applying a laminate to the gate insulating film of the TFT, the TFT exhibiting less variation in threshold voltage or subthreshold characteristic can be obtained. The above laminate is obtained by laminating the silicon oxide film and the silicon nitride film formed by RF sputtering using the silicon target and performing the heat treatment such that the resulting product is locally heated using a conductive layer formed through pattern lithography. That is, the gate insulating film can be formed of the dense silicon oxide film containing neither hydrogen nor fixed charge or the like due to the heat treatment or the laminate including the silicon oxide film and the silicon nitride film, which can contribute to the realization of the stable TFT characteristics.

Also, according to this embodiment, a gate wiring connected with the gate electrode is formed from the second conductive layer, so that a wiring width can be freely set (no peak constituted of the lower conductive layer exists) and the wirings can be arranged at the high density.

(Embodiment 6)

Figure 23A:
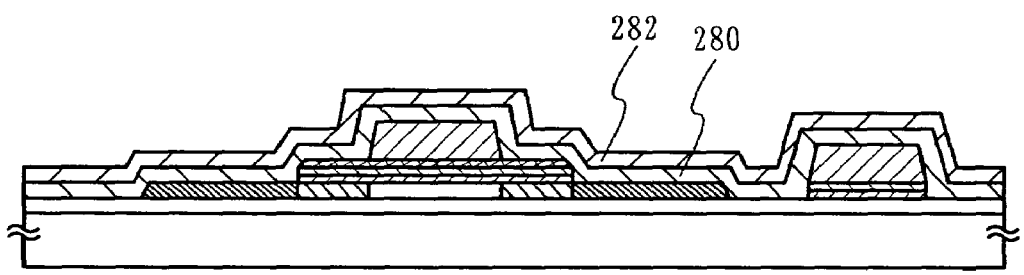
FIGS. 23A and 23B are explanatory views each showing a manufacturing method for a semiconductor device according to the present invention.
Figure 23B:
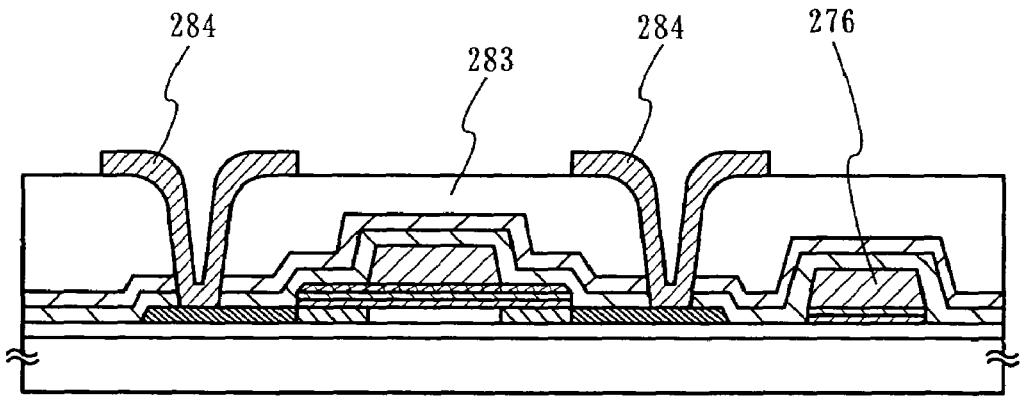

Similarly to Embodiment 1, the steps up to the hydrogenation step shown in FIG. 22A are performed. After that, as shown in FIG. 23A, a fourth insulating layer 282 is formed on the third insulating layer 280 by using a silicon nitride film formed by RF sputtering using the silicon target. The silicon nitride film is superior in barrier property, which can thus provide a blocking effect of blocking the mixing of oxygen, moisture in the air, ionic impurity such as sodium, or the like.

Further, a fifth insulating layer 283 is formed of a photosensitive or non-photosensitive organic resin material mainly containing acryl, polyimide, or the like. A wiring 284 formed of a conductive material such as Al, Ti, Mo, or W is formed in accordance with each contact hole formed in the third to fifth insulating layers. By forming the fifth insulating layer using the organic resin material, the capacitance between the wirings is reduced and the smooth surface is achieved. As a result, the high-density arrangement of the wirings can be realized on the layer.

(Embodiment 7)

In this embodiment, a description will be made of a mode using the steps different from Embodiment 1 in that annealing based on the local heating can be applied for both of the modification of the gate insulating film and the activation of the impurity regions.

Figure 25A:
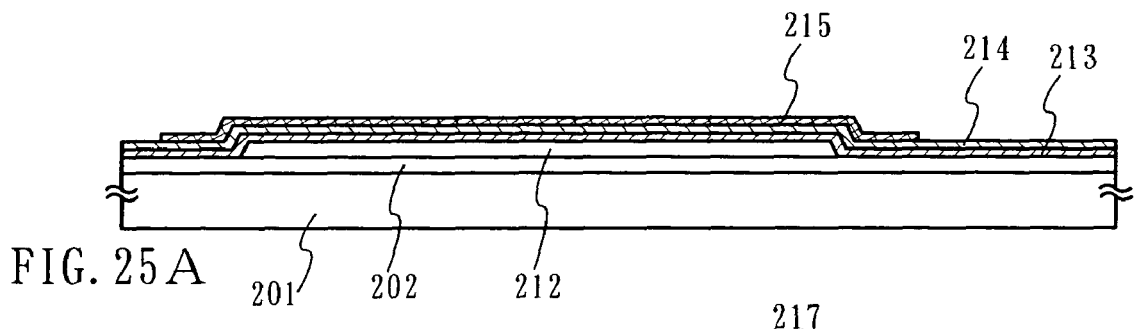
FIGS. 25A to 25E are explanatory views each showing a manufacturing method for a semiconductor device according to the present invention.

FIG. 25A shows a state where the first insulating layer 202, the semiconductor layer 212, the silicon oxide film 213, the silicon nitride film 214, and the conductive layer 215 are formed on the substrate 201. In this state, the heat treatment based on the local heating using RTA may be performed for the modification of the gate insulating film made of the laminate including the silicon oxide film and the silicon nitride film.

Figure 25B:
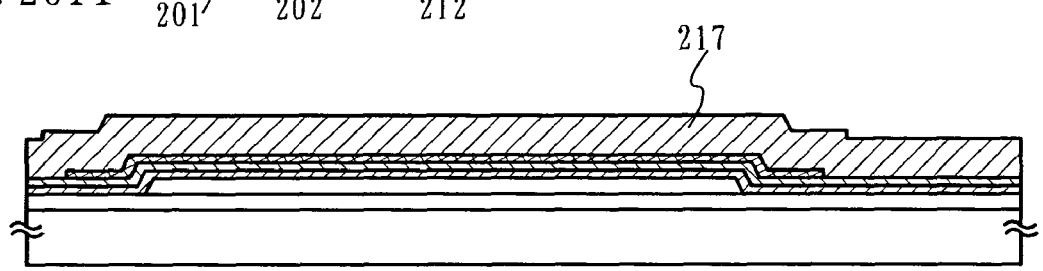
Figure 25C:
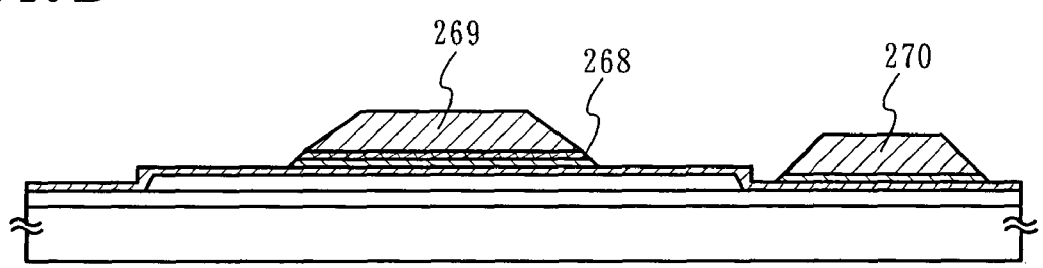

After that, the second conductive layer 217 is formed thereon (FIG. 25B). Then, the first etching process is conducted to form the first-shape gate electrode patterns 268 and 269 and the first-shape wiring pattern 270 (FIG. 25C).

Figure 25D:
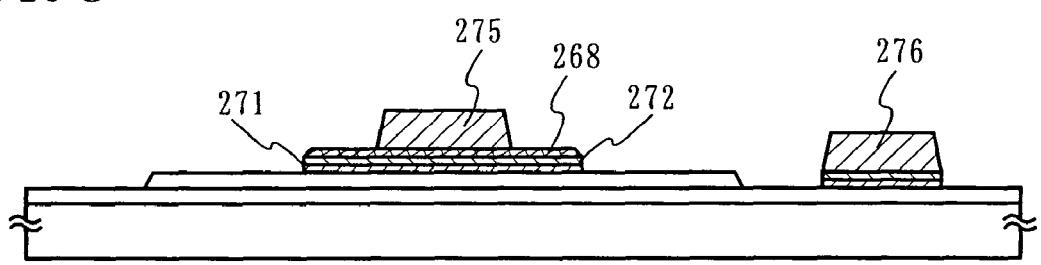

After that, the etching conditions are shifted to second etching conditions. The etching gas is changed to $SF_6$, $Cl_2$, and $O_2$ and the bias voltage applied to the substrate side is set to a predetermined value. Then, the tungsten (W) film undergoes anisotropic etching. Thus, the gate electrode is formed, which has a two-layer structure composed of the conductive layer 268 and the second conductive layer 275. The gate electrode constitutes the laminate structure composed of the conductive layer 268 and the second conductive layer 275. As viewed in section, the gate electrode takes a structure (top-hat structure) in which the conductive layer 268 protrudes outwardly like a peak. The gate insulating film is formed of the silicon oxide film 271 and the silicon nitride film 272 which are both underlying the gate electrode. At the same time, the wiring 276 is formed as well (FIG. 25D).

Figure 25E:
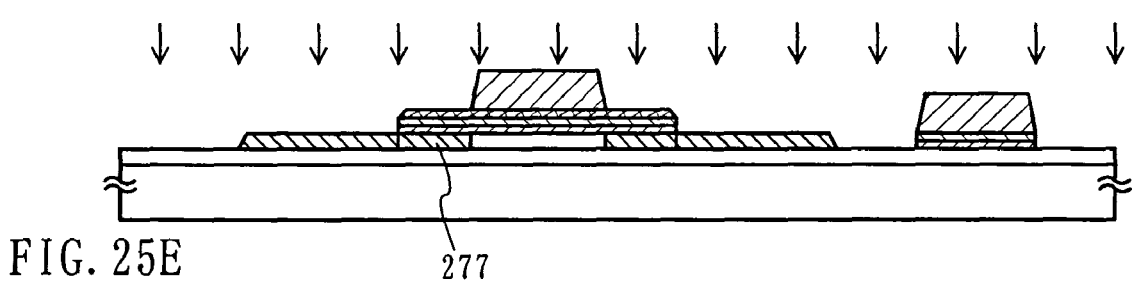
Figure 26A:
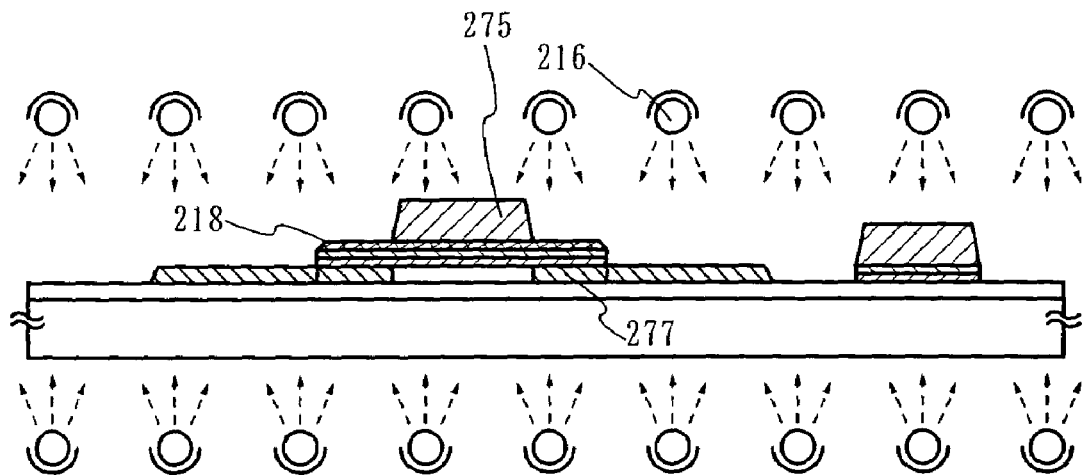
FIGS. 26A to 26C are explanatory views each showing a manufacturing method for a semiconductor device according to the present invention.

Following this, as shown in FIG. 25E, doping is performed for the formation of the first impurity regions 277. Thereafter, the heat treatment is performed using RTA for the purpose of achieving the activation of each first impurity region 277 and the modification of the gate insulating film (FIG. 26A). RTA is performed at 700 to 800° C. for 30 to 300 seconds. Also in this case, the conductive layer 268 and the second conductive layer 275 which constitute the gate electrode absorbs the radiation from the heat source to thereby enable local heating. Through the heat treatment, both of the modification of the gate insulating film and the activation of the first impurity regions can be achieved at a time. In particular, RTA increases a heat treatment effect on each first impurity region overlapping with the gate electrode to enhance an activation rate and also to modify a junction interface with the channel formation region.

Figure 26B:
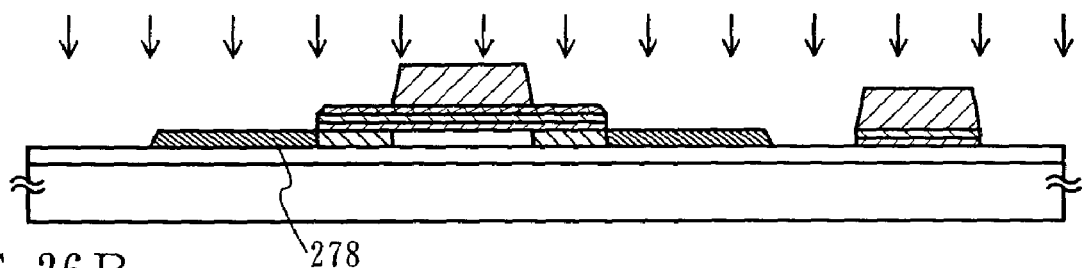
Figure 26C:
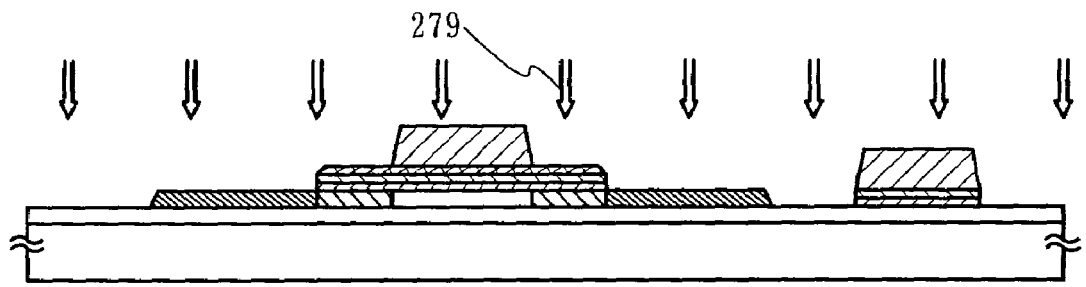

After that, as shown in FIG. 26B, the impurity ions of one conductivity type are injected at the acceleration voltage low enough to prevent the impurity ions from passing through the peak portion of the conductive layer 268, thereby forming the second impurity regions 278. Through such a doping method, the TFT of the gate overlap LDD structure can be formed. As shown in FIG. 26C, the second impurity regions 278 may be activated by irradiating the laser light 279.

The subsequent steps are conducted similarly to Embodiment 1, thereby completing the TFT.

(Embodiment 8)

Figure 27A:
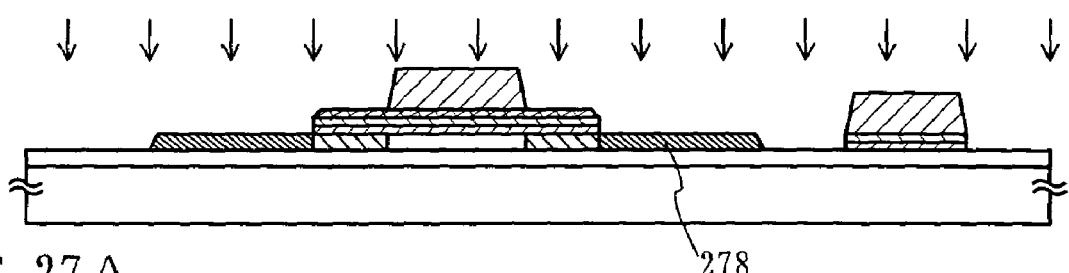
FIGS. 27A and 27B are explanatory views each showing a manufacturing method for a semiconductor device according to the present invention.
Figure 27B:
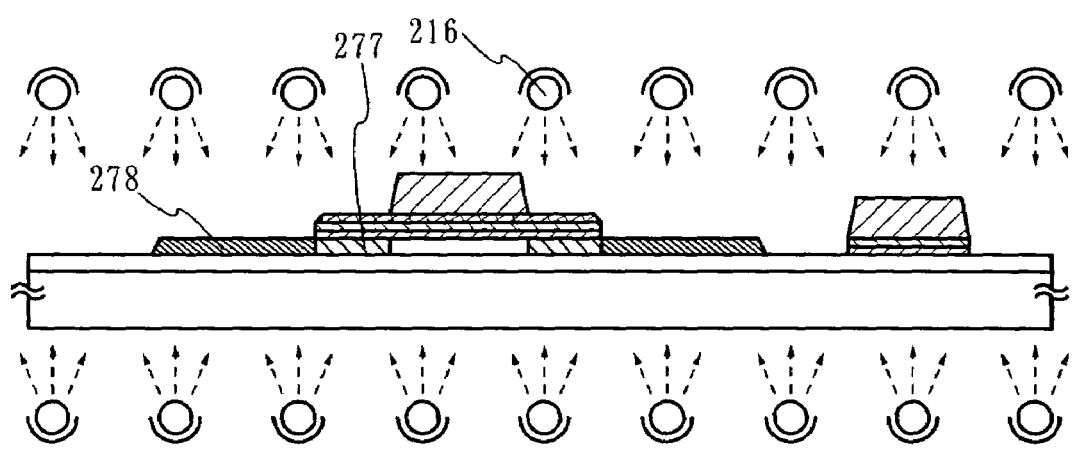

In Embodiment 7, after each first impurity region 277 is formed as shown in FIG. 25E, each second impurity region 278 is successively formed as shown in FIG. 27A. After that, as shown in FIG. 27B, the heat treatment based on the local heating using RTA may be performed for the modification of the gate insulating film and the activation of each first impurity region 277 and each second impurity region 278. This provides the same effects.

(Embodiment 9)

In this embodiment, a description will be made of a mode where the TFT of the gate overlap LDD structure is formed through the steps different from Embodiment 1.

Figure 28A:
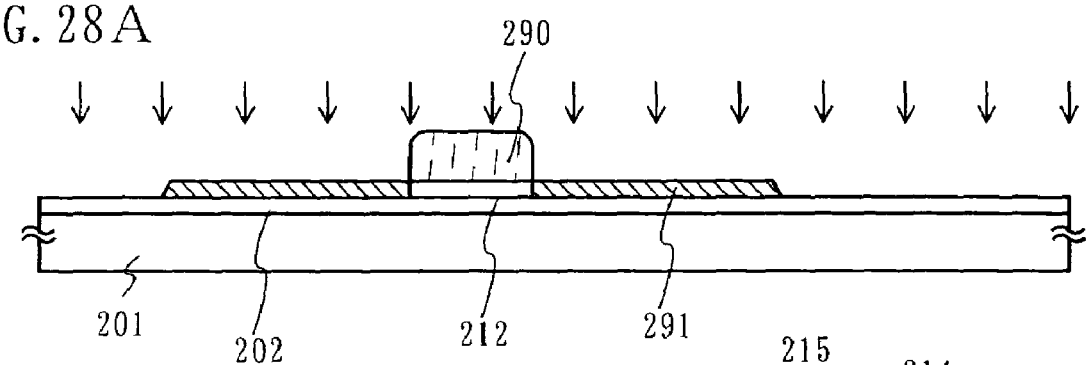
FIGS. 28A to 28D are explanatory views each showing a manufacturing method for a semiconductor device according to the present invention.

In FIG. 28A, the first insulating layer 202 and the semiconductor layer 212 are formed on the substrate 201 before the mask 290 is formed thereon. Then, first impurity regions 291 are formed through doping (FIG. 28A).

Figure 28B:
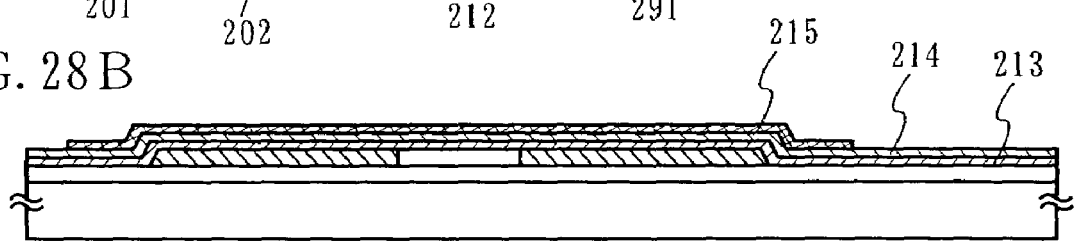

After the mask 290 is peeled off of the substrate and the organic contaminant is removed through the cyclic washing alternatively using ozone water and hydrofluoric acid or the ultraviolet (UV) ozone treatment to thereby form the clean surface, the silicon oxide film 213, the silicon nitride film 214, and the conductive layer 215 are formed (FIG. 28B).

Figure 28C:
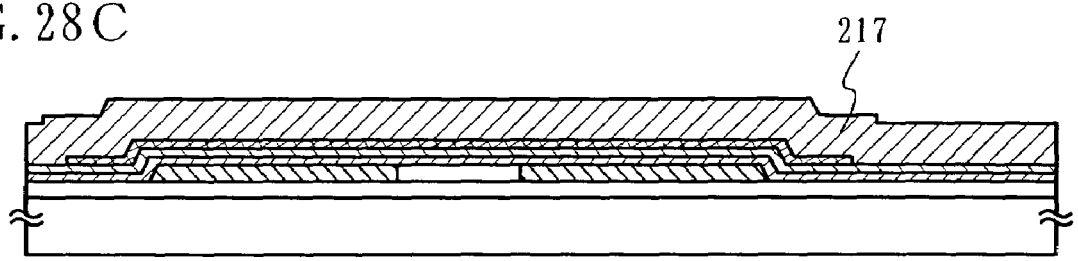
Figure 28D:
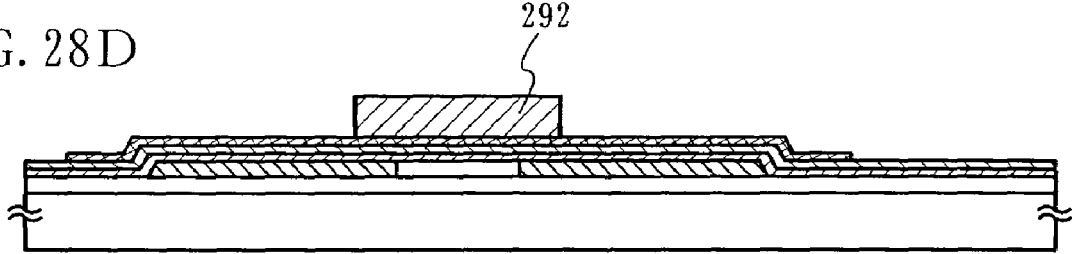

After that, the second conductive layer 217 is formed (FIG. 28C), which is etched and processed into a gate electrode pattern to form a second conductive layer 292. The gate electrode is formed at a position corresponding to the position where the mask 290 is formed so as to overlap with each first impurity region 291, thereby forming the gate overlap structure at this stage (FIG. 28D).

Figure 29A:
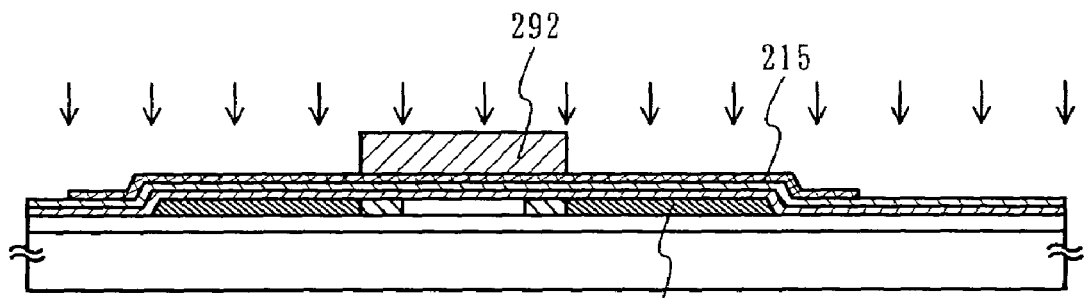
FIGS. 29A to 29C are explanatory views each showing a manufacturing method for a semiconductor device according to the present invention.
Figure 29B:
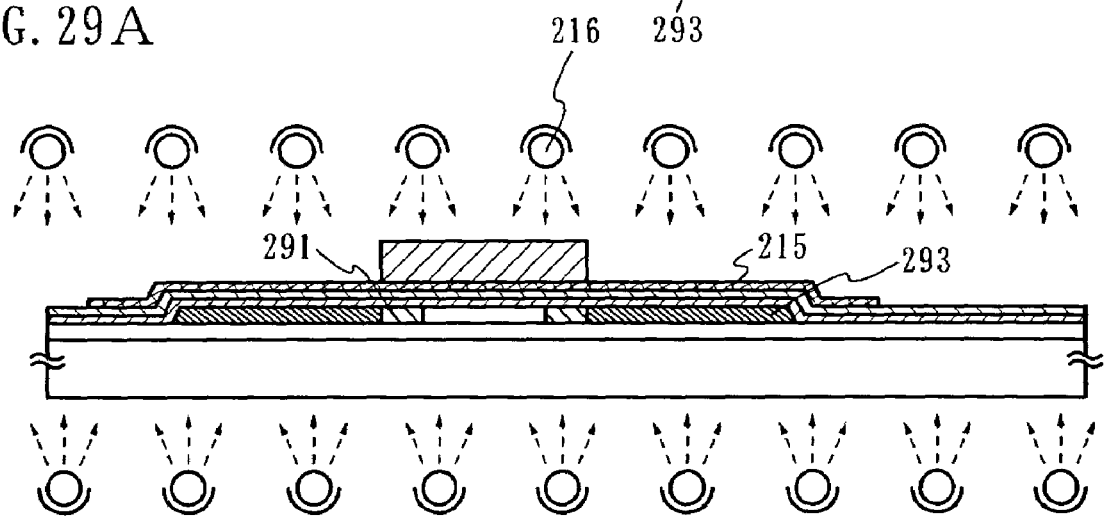
Figure 29C:
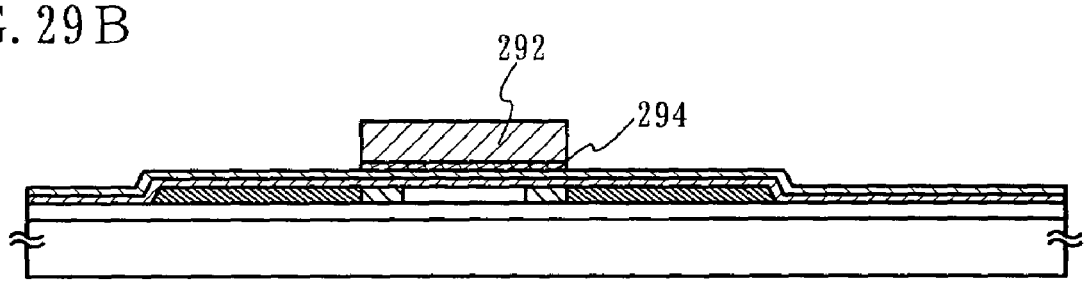

Next, as shown in FIG. 29A, in the state where the conductive layer 215 is remained, doping is conducted using the second conductive layer 292 as the mask to thereby form second impurity regions 293. Thereafter, the heat treatment is performed using RTA for the purpose of achieving the activation of each first impurity region 291 and each second impurity region 293 and the modification of the gate insulating film (FIG. 29B). RTA is performed at 700 to 800° C. for 30 to 300 seconds. In this case, the conductive layer 215 absorbs the radiation from the heat source to thereby enable local heating. Through the heat treatment, both of the modification of the gate insulating film and the activation of each first impurity region 291 and each second impurity region 293 can be achieved at a time. In particular, RTA increases a heat treatment effect on each first impurity region overlapping with the gate electrode to enhance an activation rate and also to modify a junction interface with the channel formation region. Thereafter, the conductive layer 215 is etched to form a gate electrode composed of the conductive layer 294 and the second conductive layer 292 (FIG. 29C).

In the steps of this embodiment, the heat treatment using RTA is performed only once to achieve the activation of the first and second impurity regions and the modification of the gate insulating film. The subsequent steps are conducted similarly to those of Embodiment 1, thereby completing the TFT.

(Embodiment 10)

Figure 30A:
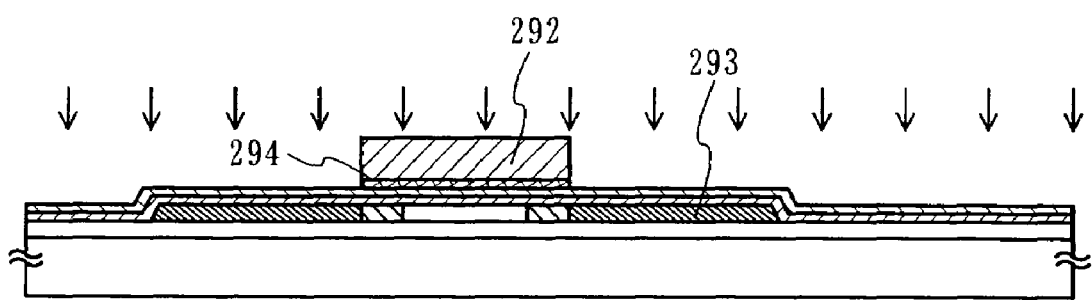
FIGS. 30A and 30B are explanatory views each showing a manufacturing method for a semiconductor device according to the present invention.

In Embodiment 9, after the steps up to that shown in FIG. 28D are similarly performed, as shown in FIG. 30A, the conductive layer 215 is etched. Thus, at this stage, the gate electrode composed of the conductive layer 294 and the second conductive layer 292 is formed. Thereafter, doping is conducted using the gate electrode as the mask to thereby form the second impurity regions 293.

Figure 30B:
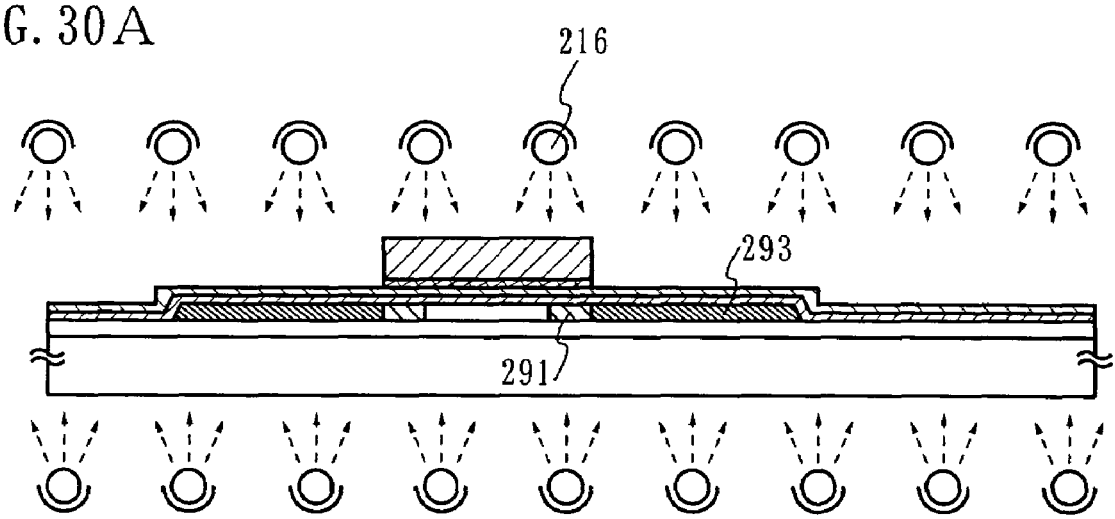

After that, as shown in FIG. 30B, the heat treatment based on local heating using RTA is performed for the modification of the gate insulating film and the activation of each first impurity region 291. Thus, the same effects can be obtained. If each second impurity region 293 is not sufficiently activated, the heat treatment may be carried out in combination with laser annealing.

(Embodiment 11)

Figure 17:
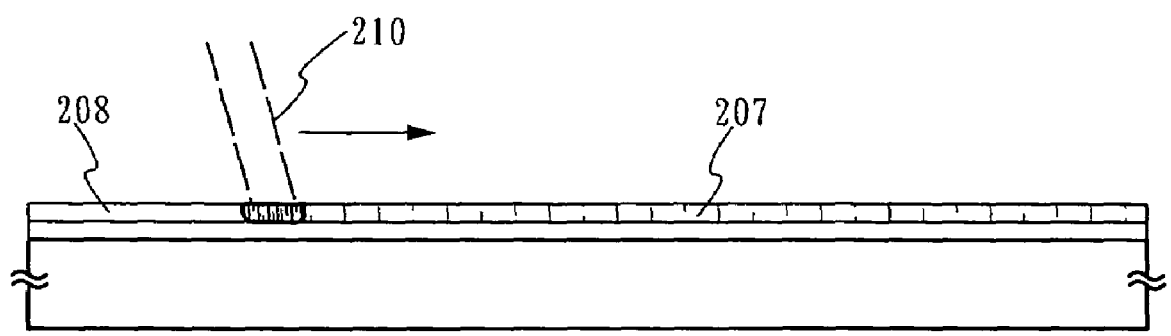
FIG. 17 is an explanatory view showing a manufacturing method for a semiconductor device according to the present invention.

In Embodiment 1, after the crystalline silicon film 207 is obtained in FIG. 8B, as shown in FIG. 17, a laser oscillator using crystal such as YAG, YVO$_4$, YLF, or YAlO$_3$, which is doped with Cr, Nd, Er, Ho, Ce, Co, Ti, or Tm is adapted for the continuous wave (CW) solid laser. A fundamental wave of the laser oscillator varies depending on the doped material, but the laser light with the fundamental wave of around 1 μm is obtained. Any higher harmonics with respect to the fundamental wave can be obtained by using a nonlinear optical element. When using the above laser oscillator, the wavelength within the visible light band and the wavelength within the UV band can be obtained with the second harmonic and the third harmonic, respectively. Typically, in an ND:YVO$_4$ laser oscillator (fundamental wave: 1064 nm), the second harmonic (532 nm) thereof is adapted. The laser light is condensed into a linear or rectangular shape and scanned at a scanning rate of 1 to 100 cm/sec, thereby improving the crystallinity.

In this step, the application of the CW laser enables the crystal grain to grow in the laser light scanning direction to thereby obtain the crystalline silicon film with a smooth surface. As a result, the maximum size of the concave and convex portions on the surface can be suppressed to 10 nm or smaller, preferably 5 nm or smaller. Needless to say, this embodiment is applicable to Embodiments 2 to 10.

(Embodiment 12)

In Embodiment 1, the crystalline silicon film 207 is formed such that the amorphous silicon film is added with the metal element having the catalytic action on the crystallization of the semiconductor and thus crystallized. However, the present invention is not limited thereto but may adopt the crystalline silicon film (or polycrystalline silicon film) formed by any well-known method. For example, a semiconductor layer may be applied thereto which is obtained by crystallizing the amorphous silicon film through the pulse oscillation laser light irradiation as described in Embodiment 1 or through the continuous wave (CW) laser light irradiation as described in Embodiment 11. The semiconductor layer of this embodiment can be substituted for the semiconductor layers of the other embodiments and similarly applied thereto.

(Embodiment 13)

Figure 18:
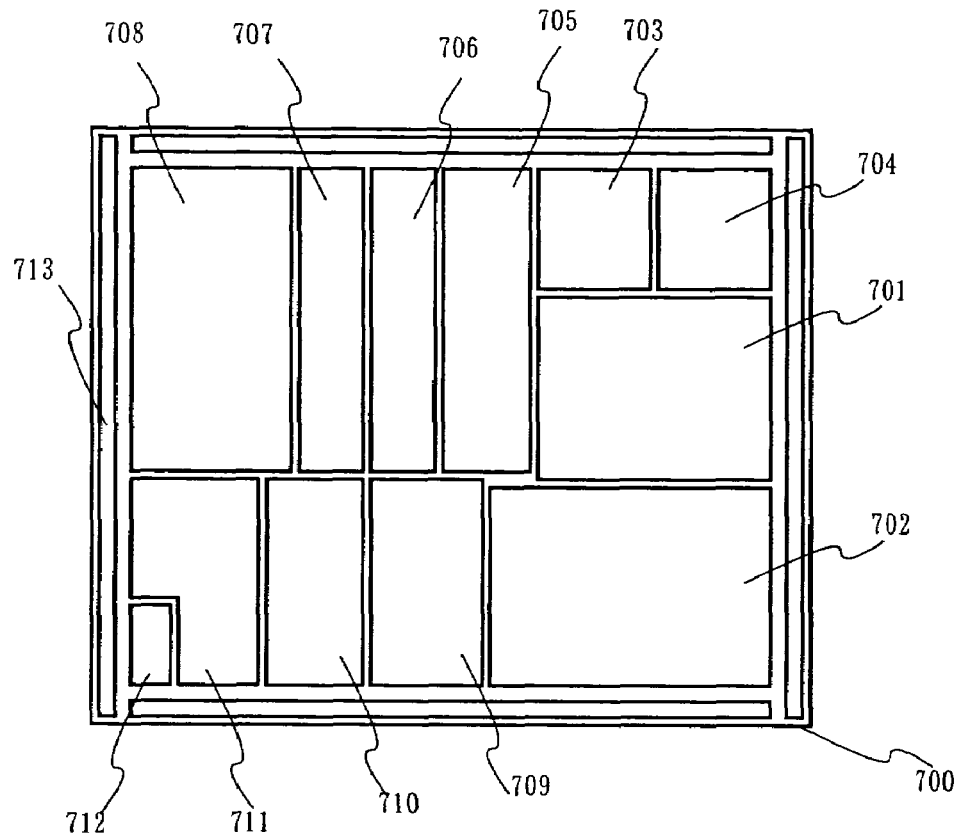
FIG. 18 is an explanatory view showing a microcomputer according to the present invention.
Figure 19:
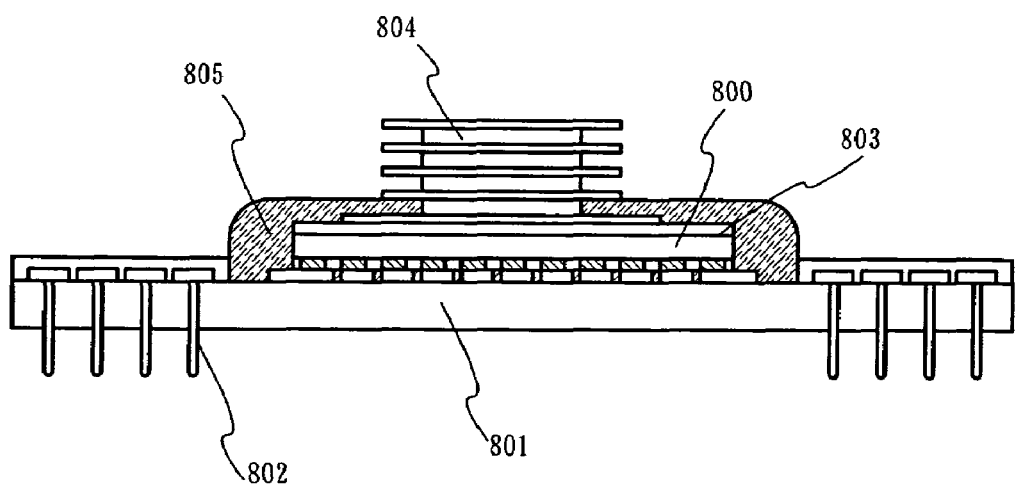
FIG. 19 is an explanatory view showing a package structure of a microcomputer according to the present invention.

Referring to FIGS. 18 and 19, an embodiment of a microcomputer as a typical semiconductor device manufactured according to Embodiments 1 to 12 will be described. As shown in FIG. 18, the microcomputer can be realized by integrating various functional circuit portions on the glass substrate with a thickness of 0.3 to 1.1 mm. The various functional circuit portions can be formed by mainly using the TFTs and capacitor portions formed according to Embodiments 1 to 5.

Components of a microcomputer 700 of FIG. 18 include: a CPU 701; a ROM 702; an interruption controller 703; a cache memory 704; a RAM 705; a DMAC 706; a clock generator circuit 707; a serial interface 708; a power generator circuit 709; an ADC/DAC 710; a timer counter 711; a WDT 712; an I/O port 713; and the like.

As shown in FIG. 19, the microcomputer 700 formed on the glass substrate is fixedly bonded to a base 801 made of ceramics or fiber-reinforced plastics (FRP) through face down bonding. A highly conductive aluminum oxynitride 803 covers the rear side of the glass substrate having the microcomputer 700 formed on the front side, thereby enhancing a heat dissipation effect. Further, a radiation fin 804 made of aluminum is arranged adjacent thereto to cope with the heat generated in association with the operation of the computer 700. The whole part is covered with a sealing resin 805 and connection with an external circuit is achieved through pins 802.

In this embodiment, the mode of the microcomputer is shown by way of example. However, by changing the configuration or combination of the various functional circuits, a semiconductor device of various functions such as a media processor, a graphics LSI, a coding LSI, a memory, a graphics LSI, or an LSI for a portable phone can be completed.

What is claimed is:

1. A manufacturing method for a semiconductor device, comprising:
    forming at least first and second semiconductor layers that are divided from each other in an island-like shape over a substrate having an insulating surface, wherein each of said first and second semiconductor layers includes a region to become at least a channel region of a thin film transistor;
    forming a conductive layer covering an entire surface of each of the first and second semiconductor layers with an insulating layer interposed therebetween;
    selectively heating the first and second semiconductor layers by irradiating an incoherent electromagnetic wave within a wavelength band ranging at least from a visible light band to an infrared band to thereby conduct heat treatment on each of the first and second semiconductor layers and the insulating layer; and
    etching said conductive layer after the selective heating of the first and second semiconductor layers to form at least first and second gate electrodes over the first and second semiconductor layers, respectively,
    wherein said conductive layer extends beyond each periphery of the first and second semiconductor layers at least when the selective heating of the first and second semiconductor layers is performed.

2. The method according to claim 1 wherein said incoherent electromagnetic wave is irradiated for 30 to 300 seconds.

3. A manufacturing method for a semiconductor device according to claim 1, wherein the substrate is a glass substrate.

4. A manufacturing method for a semiconductor device according to claim 1, wherein the substrate is selected from one of quartz and sapphire.

5. A manufacturing method for a semiconductor device according to claim 1, wherein the substrate has a transmittance of 50% or higher with respect to the electromagnetic wave within the wavelength band.

6. A manufacturing method for a semiconductor device according to claim 1, wherein the conductive layer comprises a metal nitride.

7. A manufacturing method for a semiconductor device according to claim 1, further comprising forming a second conductive layer on the conductive layer.

8. A manufacturing method for a semiconductor device according to claim 1, wherein the selective heating of the substrate is performed at a temperature not lower than a distortion point of the substrate.

9. A manufacturing method for a semiconductor device, comprising:

forming a semiconductor layer over a substrate;

forming an insulating layer over the semiconductor layer wherein said semiconductor layer includes a region to become at least a channel region of a thin film transistor;

forming a conductive layer over the semiconductor layer with the insulating layer interposed therebetween;

selectively heating the semiconductor layer by using a heat source capable of radiating an incoherent electromagnetic wave within a wavelength band ranging at least from a visible light band to an infrared band; and etching said conductive layer after the selective heating of the semiconductor layer to form a gate electrode over the semiconductor layer, wherein said conductive layer extends beyond a periphery of the semiconductor layer at least when the selective heating of the semiconductor layer is performed.

10. A manufacturing method for a semiconductor device according to claim 9, wherein a transparency of said substrate with respect to said incoherent electromagnetic wave is 50% or larger.

11. A manufacturing method for a semiconductor device according to claim 9, wherein said substrate is a glass substrate.

12. A manufacturing method for a semiconductor device according to claim 9, wherein said substrate is selected from one of quartz and sapphire.

13. A manufacturing method for a semiconductor device according to claim 9, wherein the conductive layer comprises a metal nitride.

14. A manufacturing method for a semiconductor device according to claim 9, further comprising forming a second conductive layer on the conductive layer.

15. A manufacturing method for a semiconductor device according to claim 9, wherein the selective heating of the semiconductor layer is performed at a temperature not lower than a distortion point of the substrate 16. A manufacturing method for a semiconductor device, comprising:

heating an entire surface of a substrate by radiation heating from a first heat source;

forming a semiconductor layer over the substrate;

forming an insulating layer on the semiconductor layer wherein said semiconductor layer includes a region to become at least a channel region of a thin film transistor;

forming a conductive layer on the insulating layer;

selectively heating the semiconductor layer by using a second heat source capable of radiating an electromagnetic wave within a wavelength band ranging at least from a visible light band to an infrared band; and etching said conductive layer after the selective heating of the semiconductor layer to form a gate electrode over the semiconductor layer, wherein an entire top surface of the semiconductor layer is covered by the conductive layer when the semiconductor layer is selectively heated.

17. A manufacturing method for semiconductor device according to claim 16, wherein the selective heating of the semiconductor layer is performed by using the second heat source capable of radiating an incoherent electromagnetic wave.

18. A manufacturing method for a semiconductor device according to claim 16, wherein the substrate is a glass substrate.

19. A manufacturing method for a semiconductor device according to claim 16, wherein the conductive layer is formed of a metal selected from the group consisting of molybdenum (Mo), tungsten (W), titanium (Ti), and chromium (Cr).

20. A manufacturing method for a semiconductor device according to claim 16, wherein the conductive layer is formed of a metal nitride selected from the group consisting of titanium nitride (TiN), tantalum nitride (TaN), and tungsten nitride (WN).

21. A manufacturing method for a semiconductor device according to claim 16, wherein the conductive layer is formed of one selected from the group consisting of tungsten silicide ($WSi_2$), molybdenum silicide ($MoSi_2$), titanium silicide ($TiSi_2$), tantalum suicide ($TaSi_2$), chromium silicide ($CrSi_2$), cobalt silicide ($CoSi_2$), and platinum silicide ($PtSi_2$).

* * * * *